US012340858B2

United States Patent
Ayyapureddi

(10) Patent No.: US 12,340,858 B2
(45) Date of Patent: Jun. 24, 2025

(54) APPARATUSES, SYSTEMS, AND METHODS FOR MODULE LEVEL ERROR CORRECTION

(71) Applicant: MICRON TECHNOLOGY, INC., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/822,912

(22) Filed: Aug. 29, 2022

(65) Prior Publication Data

US 2024/0071550 A1    Feb. 29, 2024

(51) Int. Cl.
| | |
|---|---|
| G11C 29/42 | (2006.01) |
| G06F 3/06 | (2006.01) |
| G06F 9/30 | (2018.01) |
| G06F 11/07 | (2006.01) |
| G06F 11/08 | (2006.01) |
| G06F 11/10 | (2006.01) |

(Continued)

(52) U.S. Cl.
CPC ............ *G11C 29/42* (2013.01); *G06F 3/0683* (2013.01); *G06F 9/30189* (2013.01); *G06F 11/0772* (2013.01); *G06F 11/08* (2013.01); *G06F 11/10* (2013.01); *G06F 11/1076* (2013.01); *G06F 11/14* (2013.01); *G06F 11/141* (2013.01); *G06F 12/0831* (2013.01); *G06F 13/1657* (2013.01); *G06F 13/36* (2013.01); *G06F 13/378* (2013.01); *G06F 2211/1066* (2013.01); *G11C 29/52* (2013.01); *G11C 2207/10* (2013.01)

(58) Field of Classification Search
CPC ............. G06F 11/1076; G06F 11/0772; G06F 9/30189; G06F 11/10; G06F 12/0831; G06F 13/1657; G06F 13/36; G06F 11/14; G06F 11/141; G06F 3/0683; G06F 11/08; G06F 13/378; G06F 2211/1066; G11C 29/52; G11C 29/42; G11C 2207/10
See application file for complete search history.

(56) References Cited

U.S. PATENT DOCUMENTS

| | | | |
|---|---|---|---|
| 5,796,672 A | 8/1998 | Pitz et al. | |
| 6,243,829 B1 * | 6/2001 | Chan ................... | G06F 11/2097 714/6.11 |

(Continued)

OTHER PUBLICATIONS

U.S. Appl. No. 17/822,915 titled "Apparatuses, Systems, and Methods for Module Level Error Correction" filed Aug. 29, 2022—pp. all pages of the application as filed.

(Continued)

*Primary Examiner* — Mark D Featherstone
*Assistant Examiner* — Sazzad Hossain
(74) *Attorney, Agent, or Firm* — Dorsey & Whitney LLP

(57) ABSTRACT

Apparatuses, systems, and methods for module level error correction. Multiple memory devices a packaged together in a memory module. The module includes a module error correction code (ECC) circuit which pools information multiple memory devices on the module. In an example read operation, multiple memory devices each provide a codeword which includes data bits and parity bits. The codewords may include data bits provided along a data bus and parity bits provided along a parity bus. The ECC circuit pools the codewords and detects errors in the pooled codewords.

16 Claims, 12 Drawing Sheets

(51) Int. Cl.
*G06F 11/14* (2006.01)
*G06F 12/0831* (2016.01)
*G06F 13/16* (2006.01)
*G06F 13/36* (2006.01)
*G06F 13/378* (2006.01)
*G11C 29/52* (2006.01)

(56) References Cited

U.S. PATENT DOCUMENTS

| | | |
|---|---|---|
| 7,134,069 B1 | 11/2006 | Longwell et al. |
| 7,257,763 B1 * | 8/2007 | Srinivasan .......... G06F 11/1064 |
| | | 714/764 |
| 7,487,428 B2 | 2/2009 | Co et al. |
| 10,635,531 B2 | 4/2020 | Cha et al. |
| 10,725,841 B1 | 7/2020 | Rahul et al. |
| 11,416,335 B2 | 8/2022 | Cho et al. |
| 11,442,811 B1 | 9/2022 | Chung et al. |
| 11,462,292 B1 | 10/2022 | Kim et al. |
| 11,763,813 B2 | 9/2023 | Alon et al. |
| 11,803,437 B1 * | 10/2023 | Willey .................... G11C 29/52 |
| 2005/0001653 A1 | 1/2005 | Ahmad |
| 2008/0256281 A1 | 10/2008 | Fahr et al. |
| 2010/0005366 A1 * | 1/2010 | Dell ........................ G11C 29/70 |
| | | 714/764 |
| 2011/0047427 A1 | 2/2011 | Bailey et al. |
| 2012/0287729 A1 * | 11/2012 | Hirobe ..................... G11C 7/10 |
| | | 365/189.05 |
| 2013/0007350 A1 | 1/2013 | D'Abreu et al. |
| 2013/0305123 A1 * | 11/2013 | Billing ................... G11C 29/42 |
| | | 714/764 |
| 2015/0378740 A1 * | 12/2015 | Moyer .................. G06F 9/3875 |
| | | 712/219 |
| 2020/0278908 A1 | 9/2020 | Schaefer et al. |
| 2023/0315565 A1 | 10/2023 | Sutera et al. |
| 2024/0070025 A1 | 2/2024 | Ayyapureddi |
| 2024/0071549 A1 | 2/2024 | Ayyapureddi |

OTHER PUBLICATIONS

U.S. Appl. No. 17/822,909 titled "Apparatuses, Systems, and Methods for Module Level Error Correction," filed Aug. 29, 2022—pp. all pages of the application as filed.
U.S. Appl. No. 17/822,918 titled "Apparatuses, Systems, and Methods for Memory Module Data Drivers" filed Aug. 29, 2022—pp. all pages of the application as filed.
Intel 6400/6402 Advanced Memory Buffer Datasheet, 250 pages, Oct. 2006.

* cited by examiner

1100

| SETTING | VALUE |
|---|---|
| Module ECC Active | ON/OFF |
| Parity Bus | ON/OFF |
| ECC Implementation | SECDED/DEC/TEC |
| Active External DQs | x4/x8/x16 |
| Active Data Bus DQs | Match/Double/Quadruple |
| Multi-level Signaling | OFF/PAM4 |
| ECC Sub-Division | OFF/2 Parts/4 Parts |

FIG. 11

APPARATUSES, SYSTEMS, AND METHODS FOR MODULE LEVEL ERROR CORRECTION

BACKGROUND

This disclosure relates generally to semiconductor devices, such as semiconductor memory devices. The semiconductor memory device may include a number of memory cells which are used to store information. The stored information may be encoded as binary data, and each memory cell may store a single bit of the information. Information may decay or change in the memory cells due to a variety of different errors, which may lead to one or more bits of incorrect information (e.g., bits with different states that the bit which was originally written) being read out from the memory device.

There may be many applications where it is useful to ensure a high fidelity of information read out from the memory. Memory devices may include error correction circuits, which may be used to determine if the information read out of the memory cells contains any errors compared to the data written into the memory cells.

BRIEF DESCRIPTION OF THE DRAWINGS

FIG. 11 is a module settings register according to some embodiments of the present disclosure.

DETAILED DESCRIPTION

Figure 1:
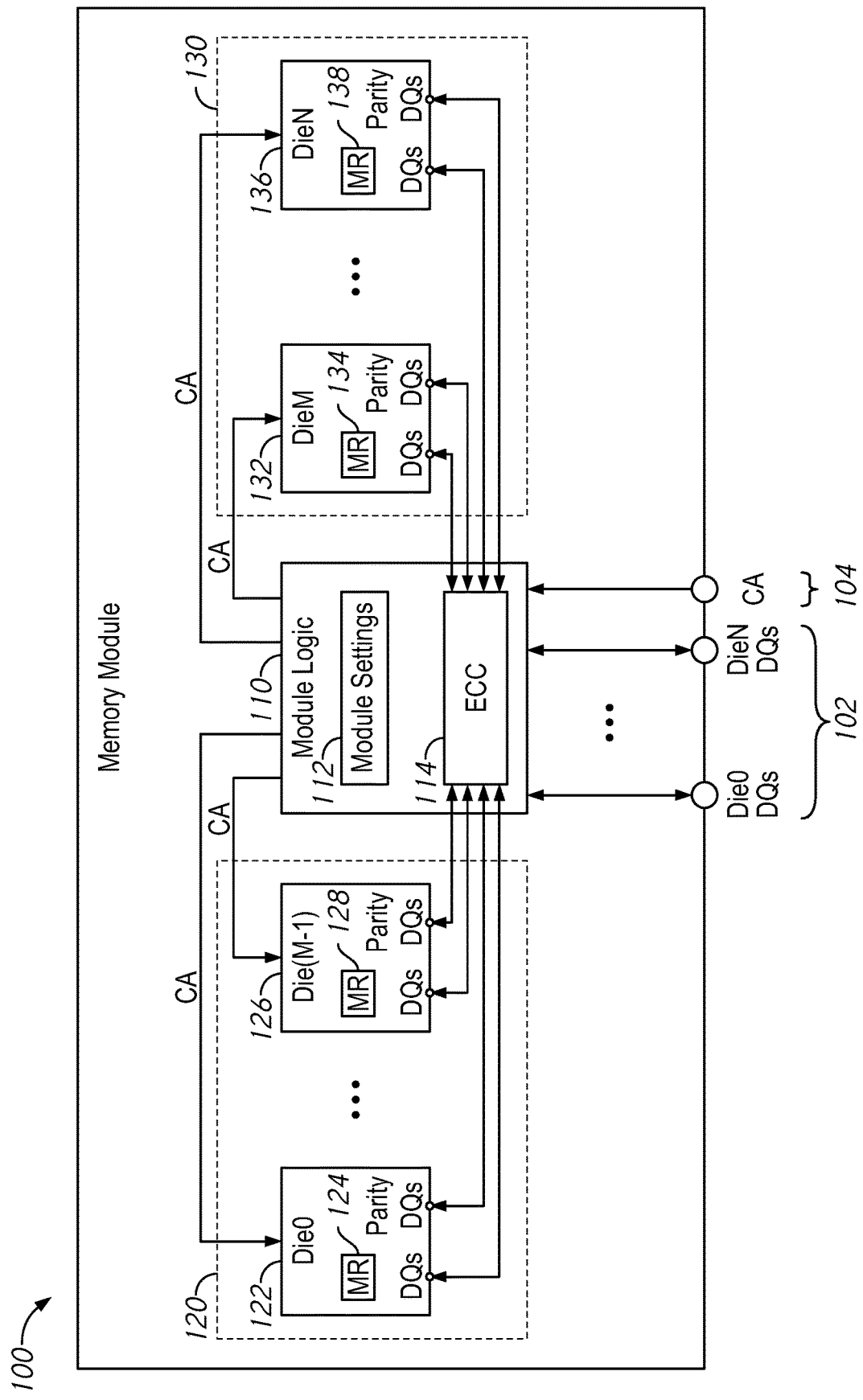
FIG. 1 is a block diagram of a memory module according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a memory array which has a number of memory cells, each located at the intersection of a word line (row) and digit line (column). During a read or write operation, a row may be activated, and data may be read from, or written to, the memory cells along the activated row. Each row may include memory cells which store a number of bits of data and a number of bits of parity information (e.g., data bits and parity bits), which may be used to correct up to a certain number of errors in the data bits. For example, a row may include one or more codewords, each of which includes M data bits and K parity bits, which may be used to detect up to A bits and/or to correct up to B bits of the M data bits or one of the K parity bits. For example, in an embodiment where the codeword is 128 data bits and 8 parity bits, single-error-correction (SEC) ECC implementation may locate and correct up to one bit of error in the 128 data bits based on the 128 data bits and the 8 parity bits. During a write operation the parity bits may be generated by an error correction code (ECC) circuit based on the data written to the memory cells of the row. During a read operation the error correction code circuit may use the parity bits to determine if the read data bits are correct, and may correct any errors which are found in the data as it is being provided off the memory device.

Multiple memory devices may be packaged together onto a memory module. For example, the module may have external connections which couple the memories to a controller. The memories on the module may be grouped together into channels, and during an example access operation, data may be sent to or from the memories in a selected channel. For example, if each codeword from a memory is 128 bits (plus 8 parity bits), and there are 5 memories per channel, then when the controller accesses a channel it may receive 640 data bits. In a conventional memory, each memory may include its own ECC circuits and may perform error correction 'locally' (e.g., the parity bits may not leave the memory). As memory processes become smaller and smaller, and as the requirements for data fidelity become more strict, it may be useful to be able to catch more and more errors. However, the number of errors which can be detected and/or corrected may be limited by the number of available parity bits. There may be a need to increase error correction and/or detection capabilities without increasing the number of parity bits on the memory (which would require increasing the number of memory cells not used for data).

The present disclosure is directed to apparatuses, systems, and methods for module level error correction. A memory module includes a number of memory devices. The memory includes memory logic including a module error correction code (ECC) circuit. During an example access operation, such as a read, each memory may retrieve a codeword including a set of data bits and parity bits. The entire codeword, including the parity bits, is provided to an ECC circuit on the module logic. In other words, the module ECC circuit pools data and parity from multiple memories on the module. For example, using the example discussed above with five memories per channel and a codeword which includes 128 data bits and 8 parity bits, the module ECC circuit may handle 640 data bits and 40 parity bits during an access. The increased number of parity bits may allow for additional flexibility of ECC operations, such as an increased number of error bit detection/correction.

In some embodiments, to enable the pooling of data and parity at the module ECC circuit, various changes may be made. For example, the memories may include additional memory input/output terminals to provide the parity bits to the module logic. In some embodiments, to prevent a bottleneck, changes may be made to the protocol(s) used to transmit codewords between the memories and the module logic. For example, multilevel signaling (e.g., PAM4) may be used. In another example, the memory may use more data bus lines within the module to transmit the codeword to the ECC circuit than it uses external data terminals to provide the codeword to an external controller.

In some embodiments, the use of the module ECC circuit may be a selectable feature. For example, each memory may also have its own ECC circuit, and a settings register of the module may determine whether the module ECC circuits or the memory ECC circuits is active. Similarly, various operations of the module level ECC circuit may be selected (e.g. what level of error detection/correction is used by the module ECC circuit).

In some embodiments, the pooled data and parity may be subdivided to reduce the latency of the module ECC. For example, the pooled data and parity bits may be split into multiple portions, each of which may be used to detect/correct errors within that portion. For example, using the example numbers discussed above, if the module ECC circuit receives a total of 640 data bits and 40 parity bits, it may process that in four portions of 160 data bits and 10 parity bits each.

FIG. 1 is a block diagram of a memory module according to some embodiments of the present disclosure. The memory module 100 is a device which packages together several memories (e.g., memory dice 122, 126, 132, and 136). Each memory includes a memory array which stores information. A controller (not shown) accesses one or more of the memories by passing commands and addresses along command and address (CA) terminals 104 and sends and receives data to/from one or more memories along data terminals (DQ) 102. The module 100 includes module logic 110, which may include a buffer which acts to help routing of command, address, and/or data between the external terminals of the module (e.g., the CA terminals 104 and DQ terminals 102) and the corresponding terminal(s) of the memories. For example, each memory may have CA and DQ terminals, coupled to the external terminals through the module logic 110. The module logic 110 includes an error correction code (ECC) circuit 114, which locates and/or corrects errors in the data read from the accessed memory dies based on parity bits read out from the memory dies to the ECC circuit 114.

The memories on the module 100 may be organized into channels. For example, the module 100 in FIG. 1 shows two channels 120 and 130. More or fewer channels per module may be used in other example embodiments. Each channel includes a number of memories. For example, the first channel 120 includes memories 0 to M−1, while the second channel 130 includes memories M to N. For the sake of brevity, only four memories, 122, 126, 132, and 136 are shown. In some example embodiments, there may be five memories per channel (e.g., M is 5 and N is 9). For the sake of consistency, five memories per channel will generally be used when example numbers are given herein. However, more or fewer memories per channel may be used in other example embodiments.

During an example access operation, the module 100 receives an access command and addresses along external CA terminals 104. The addresses may specify which channel should be accessed, as well as details about what memory cell(s) within the selected memories should be accessed. The module logic 110 routes the commands and addresses to the selected channel, and all of the memories of that channel may be accessed together. In an example read operation, each memory of a selected channel provides a codeword from the memory cells specified by the address information at DQ terminals of the memory. The codewords are provided through the module logic 110 and the ECC circuit 114 to external DQ terminals 102 to the controller. In an example write operation, the controller provides the codewords to the external DQ terminals 102 along with command and address information at the CA terminals 104 which indicates which memory cells the data in the codewords should be written to. The module logic 110 provides the codewords to the memories of the specified channel, and the codewords are written to the specified memory cells.

The module 100 has various external terminals, such as DQ terminals 102 and CA terminals 104. The module 100 may also have additional terminals not shown in FIG. 1, such as clock terminals, power terminals, sideband channels (e.g., alert pins) etc. The module 100 has a set of external DQ terminals 102 which may correspond to the DQ terminals on the memories. Each DQ terminal on a memory may correspond to an external DQ terminal 102. For example, if each memory has 16 DQ terminals, and there are 10 total memories (e.g., two channels of 5 memories each) then there may be 160 total external DQ terminals 102. In some embodiments, the memories of a channel may share external DQ terminals with the memories of another channel. For example, there may be another set of two channels (not shown in FIG. 1) on the back side of the module's chip and those modules may use the same external DQ terminals 102 as the first channel 120 and the second channel 130. For example, there may be four channels, each with five memories, each with 16 DQs on the memory and 160 total external DQ terminals 102, 80 of which are shared by the first and the third channel and 80 of which are shared by the second and the fourth channel.

The module logic 110 includes ECC circuits 114, which locate and detect errors in the codewords. Internal codewords within the memory module 100 include a set of data bits and a set of parity bits, which are used for error correction purposes by the ECC circuit. During a write operation, the ECC circuit 114 receives external codewords which include data bits and generates parity bits based on that data, to generate internal codewords which include both the data and the parity bits. The ECC circuit 114 may pool the data bits of the received codewords and generate the parity bits based on the pooled data bits. The generated parity bits may then be divided up to match a number of codewords (e.g., a number of memories per channel) to form the internal codewords. These internal codewords are then written to the selected memories. During an example read operation, a set of internal codewords are retrieved from the selected memories, each which includes a set of data bits and a set of parity bits. The ECC circuit 114 pools the data bits and parity bits and locates and/or corrects errors based on the data bits and the parity bits and provides the data bits (but not the parity bits) to the external DQ terminals 102.

The data and parity bits used by the ECC circuit 114 may be pooled across memories of a channel. For example, if each codeword includes A data bits and B parity bits, and there are M memories per channel, then the ECC circuit 114 may operate based on a set of M*(A+B) bits. In other words, while each memory in a channel stores B parity bits, the value of those B parity bits may be based, at least in part, on data bits stored in other memories of the channel. Similarly, the ECC circuit 114 may operate based on parity and data received from multiple memories of a channel, rather than operating on a codeword by codeword basis. As explained in more detail herein, the pooling of data and parity from multiple memories may allow for increased ECC capabilities. While the ECC circuit 114 may operate on pooled information, the data and parity may still be split into codewords to be stored on the individual memories.

During an example write operation, the ECC circuit 114 receives a set of codewords which include a number of bits of data. For example, if there are five memories per channel, and each of the five codewords includes 128 bits, then there may be 640 total data bits. Based on the data bits, the ECC circuit generates a set of parity bits. While not required, for ease of storage, in some embodiments the ECC circuit 114 may generate a number of parity bits which is divisible by the number of memories in channel. For example, the ECC circuit 114 may generate 40 parity bits, 8 of which may be stored on each memory of the channel. In some embodiments, the ECC circuit 114 may take advantage of existing memory architecture and generate a number of parity bits based on a number of parity bits used by on-memory ECC circuits.

The module 100 includes a set of data buses which couple each memory's DQ pads to the module logic 110, and through the module logic 110 to the external DQ terminals 102. The module 100 also includes a set of parity buses which couple the ECC circuit 114 to parity DQ terminals of each memory. Each memory has a set of data DQ terminals for data and a set of parity DQ terminals for the parity bits. For example, if each memory receives a 136 bit codeword (128 data bits and 8 parity bits), there may be 16 data DQ terminals and 1 parity DQ terminal, each of which receives a burst of 8 bits. Different arrangements of terminals and/or different bust lengths may be used in other example embodiments.

The module logic 110 includes a module settings register 112. The module settings register 112 may be a set of programmable registers which are used to set one or more values for the operation of the module 100. The module settings register 112 may act in a fashion analogous to the mode registers of the memories. Each memory may have a mode register, which includes a number of registers which store values related to the operation of the memory. For example, memory 122 includes mode register 124, memory 126 includes mode register 128, memory 132 includes mode register 134, and memory 136 includes mode register 138. The module settings register 112 (optionally in conjunction with the mode registers of the memories) may work to enable various settings of the module 100. For example, in some embodiments, the ECC circuit 114 may be a user selectable feature, and a register in the module settings register 112 may be used to disable the ECC circuit 114. An example module settings register is discussed in more detail in FIGS. 11-12.

In some embodiments, the module 100 may use one or more methods to increase the speed at which internal codewords are transmitted from the memories of an accessed channel. For example, the module 100 may be operated in a mode where less than all of the physical DQ terminals of the memories are required. For example, the memory may include 16 physical data DQ pads, but may operate in an x8 mode where only 8 DQ pads are required and only 8 external data terminals per memory are used, or an x4 mode where 4 data DQ pads are required and 4 external data terminals per memory are used. To increase the speed at which data is transmitted to the ECC circuit 114, the extra DQ pads may be used to transmit information to the ECC circuit 114, even though fewer than all of the external DQ terminals 102 are used. In some embodiments, multi-level signaling may be used, where more than two voltages are used to represent more than two logical states of the signal along the bus. For example, PAM4 may be used, where four voltages represent four possible logical levels (e.g., 0, 1, 2, and 3). Such methods to increase the speed at which internal codewords are transmitted may be settings of the module and of the memory. Accordingly, the module settings 112 and mode registers of the memories may have registers which are used to set which signaling mode(s) are active. Examples of different signaling protocols are discussed in more detail in FIGS. 6-8.

In some embodiments, the ECC circuit 114 may process the pooled information from the accessed channel in portions. For example, it may take time for the ECC circuit 114 to process the relatively large amount of information in codewords from all the memories of the accessed channel. To increase the speed at which the ECC circuit 114 operates, it may break the total amount of information into portions and process each portion. If the ECC circuit 114 takes advantage of the serialization of data and parity bits along the data and parity buses, it may also begin processing a first portion while a second portion is being received. Examples of sub-dividing the pooled information is discussed in more detail in FIGS. 9-10.

Figure 2:
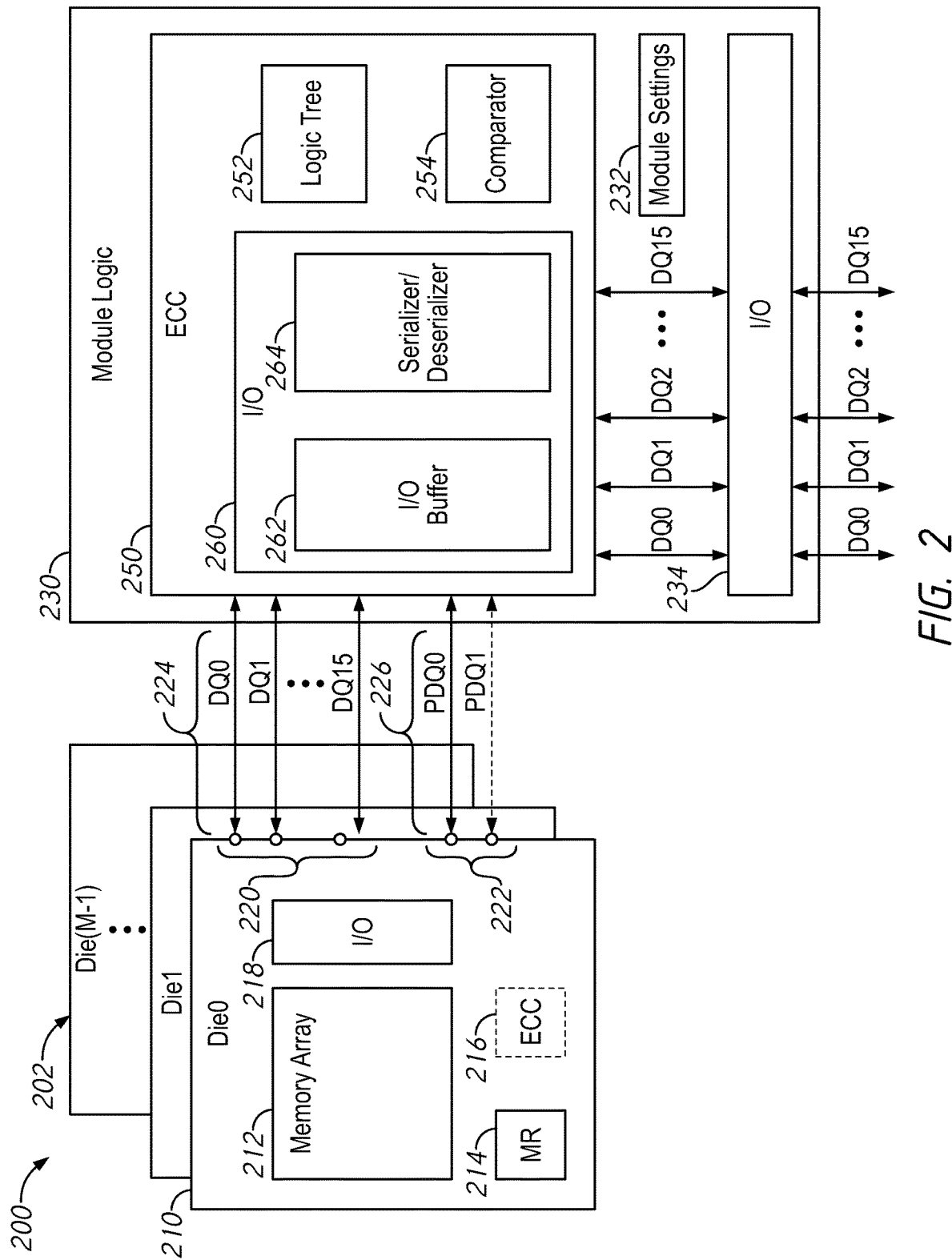
FIG. 2 is a block diagram of a memory module according to some embodiments of the present disclosure.

FIG. 2 is a block diagram of a memory module according to some embodiments of the present disclosure. The memory module 200 of FIG. 2 may, in some embodiments, represent components of the memory module 100 of FIG. 1. FIG. 2 highlights the interaction of a single channel 202 (e.g., channel 120 or 130 of FIG. 1) with the ECC circuit 250.

The memory module 200 includes a channel 202, which includes a set of M memory devices. The memories are coupled along data buses 224 and parity buses 226 to the module logic 230 (e.g., 110 of FIG. 1). Since the memory devices and their buses may be broadly similar to each other, only single memory 210 (e.g., 122 of FIG. 1) will be described in detail. The module logic 230 includes an ECC circuit 250 (e.g., 114 of FIG. 1). In an example read operation, the ECC circuit 250 pools the data and parity bits received along the data buses 224 and parity buses 226 from the memories of the channel 202 and locates and/or corrects errors in the pooled information. The data is then provided to an external device (e.g., a controller). In an example write operation a pool of data is received for multiple memories of the channel by the ECC circuit 230, which generates parity bits based on that pooled data and provides the data and parity bits to the memories of the channel 202.

The channel 202 includes a set of M memory devices, such as memory device 210. The memory device 210 includes a memory array 212 which stores data and parity bits. The memory device 210 also includes an input/output (I/O) circuit 218, which couples data to/from the memory array 212 and the memory's data terminals 220 and parity terminals 222. The memory may include additional terminals (e.g., power terminals, clock terminals, CA terminals, etc.) not shown in FIG. 2. The memory 210 may also include a mode register 214 which may be used to manage various settings of the memory. For example, the mode register 214 may include settings which control how many data terminals 220 are used, a burst length along the data buses, etc. An example memory device is described in more detail in FIG. 4.

The module logic 230 includes an ECC circuit 250 and an I/O circuit 234. The I/O circuit sends and receives data to and from external data terminals of the memory module (e.g., 102 of FIG. 1). There may be sets of external data terminals corresponding to the number of data terminals on a memory device. For example, if memory 210 has 16 data terminals, then there may be 16 external data terminals in a set, and the module may have at least as many sets as there are memories in a channel. The module logic 230 also includes a module settings register 232, which stores various settings for the operation of the module 200, such as how many data terminals are used, how many data busses 224 are used, how the ECC is operated etc.

The memory 210 is coupled to the module logic 230 along data buses 224 and parity buses 226. For the sake of brevity, only a single set of buses 224 and 226 are shown (corresponding to the memory 210), however there may be similar data buses 224 and parity buses 226 for each of the memories in the channel 202. Each data bus 224 may couple a data terminal 220 of the memory to the module logic 230. For example, there may be 16 DQ terminals 220 per memory, and thus 16 data bus lines 224 in a set. If there are five memories in the channel 202, there may be 80 total data bus lines per channel. The memory 210 includes additional parity data terminals 222, which couple parity bits along parity buses 226 to the memory module 230. In some embodiments, there may be one parity bus line per memory. In some embodiments multiple parity bus lines per memory.

Data may be provided between the memory 210 and the module logic 230 in a serial format. The overall data bits of the codeword may be split among the data buses 224 and in parallel, but each data bus line may carry a set of bits in series in a burst. For example, if a burst length of 16 is used, then each data bus line may carry 16 bits in series. If a burst length of 8 is used, then each bus may carry 8 bits in series. For example, if the codeword includes 128 data bits per memory, then 16 data buses 224 and a burst length of 8 may be used. If 8 data buses 224 are used (e.g., as part of an x8 mode), then a burst length of 16 may be used. Other arrangements of data buses and burst lengths may be used in other example embodiments, and the number of data buses and the burst length may be selectable (e.g., based on settings in the mode register 214 of the memory 210 and/or buffer settings 232 of the module logic 230).

The ECC circuit 250 includes an I/O circuit 260 which receives data and parity bits provided to the ECC circuit 250 and converts them to a format that the ECC circuit 250 can use. For example, the I/O circuit 260 may include an input/output buffer 262 and serializer/deserializer circuits 264. The codewords may be received (e.g., from the memories of the channel 202 along data busses 224 and/or from the external terminals through I/O circuit 234) in serial format. The I/O buffer 262 stores the serial information as it is received so that it may be deserialized by the deserializer circuit 264. The deserialized information may then be operated on by the ECC circuit 260. Once the information has been processed, it may be stored in the buffer 262 while it is serialized again by the serializer 264.

The ECC circuit 250 includes a logic tree 252 and a comparator circuit 254 which may be used to generate the parity bits based on the data as part of a write operation and/or use the data and parity bits to check for errors in a read operation. The logic tree 252 includes a number of logic circuits, such as XOR logic gates, which may be arranged in various fashions to generate parity bits based on different combinations of input bits. The comparator 254 compares an output of the logic tree 252 to the parity bits read out from the channel 202 as part of a read operation. The comparator 254 provides a signal which indicates if an error was detected and (if correction is used) which of the data bits is in error. If error correction is used (as opposed to just detection), then the identified error bit(s) may have their state inverted to correct them. Example read and write operations are described in more detail with respect to FIG. 3.

In some modes, fewer than all of the physical data terminals 220 and data buses 224 may be used. For example, in an x8 mode of the memory, while there may be 16 data buses 224 and 16 DQ terminals both on the memories 210 and external to the module, only 8 of those external DQ terminals may be used. Similarly, an x4 mode may use 4 external DQ terminals. Since fewer than all of the data buses are required in the x8 and x4 modes, in some embodiments, those buses may be used to convey data between the memories and the ECC circuit 250 in a quicker time than could otherwise be done. For example, if the memory is in an x8 mode, then all 16 data buses 224 may still be used to convey the data bits twice as fast to ECC circuit 250. In such an embodiment, settings in both the mode register 214 and the module settings 232 may be used to enable this optional feature. An example embodiment where non-required DQs are used is discussed in more detail in FIG. 6.

In some embodiments multi-level signaling may be used along the data buses 224 and/or parity buses 226. In a multi-level signaling protocol, more than two voltages are used to represent more than two logical levels. Accordingly, more information may be conveyed across a signal line. For example, if four logical levels are used, then the logical states of two bits may be simultaneously conveyed (e.g., 00=a first voltage, 01=a second voltage, and so forth). In such an embodiment, settings in both the mode register 214 and the module settings 232 may be used to enable this optional feature. An example embodiment where multi-level signalling is used is discussed in more detail in FIG. 7.

In some embodiments, the memory 210 may include an optional memory-level ECC circuit 216. Similar to the module level ECC circuit 250, the memory-level ECC circuits 216 receive data bits as part of a write operation and generate parity bits based on those received data bits, and during a read operation detect/correct errors based on the data and parity bits. However, unlike the module-level ECC circuit 250, the memory level ECC circuits 216 operate on the data of a single codeword. For example, when the memory-level ECC circuits 216 are enabled, they may receive a codeword (e.g., 128 data bits) and generate parity bits based on those data bits (e.g., 8 parity bits) and use the parity and data bits to locate and correct errors. Since the memory level ECC circuits 216 may have fewer parity bits to work with than the module-level ECC circuit 250, the memory level ECC circuits 216 may not have as much flexibility in terms of the number of bits which can be detected/corrected. For example, the memory-level ECC circuit 216 may implement a single-error detection/single-error correction (SEDSEC) ECC procedure.

In embodiments where the memories include ECC circuits 216, the operation of the memory level ECC circuits 216 and module-level ECC circuit 250 may be optional. Settings on the module settings 232 may enable or disable the operation of the ECC circuit 250. Settings in the mode registers 214 of the memories (e.g., 210) of the channel 202 may be used to enable/disable the ECC circuits 216. In situations where the ECC circuits 216 are enabled by the module-level ECC circuit 250 is disabled, the parity buses 226 may not be used, since the parity used by the memory level ECC circuits 216 may not leave the memory devices.

Figure 3:
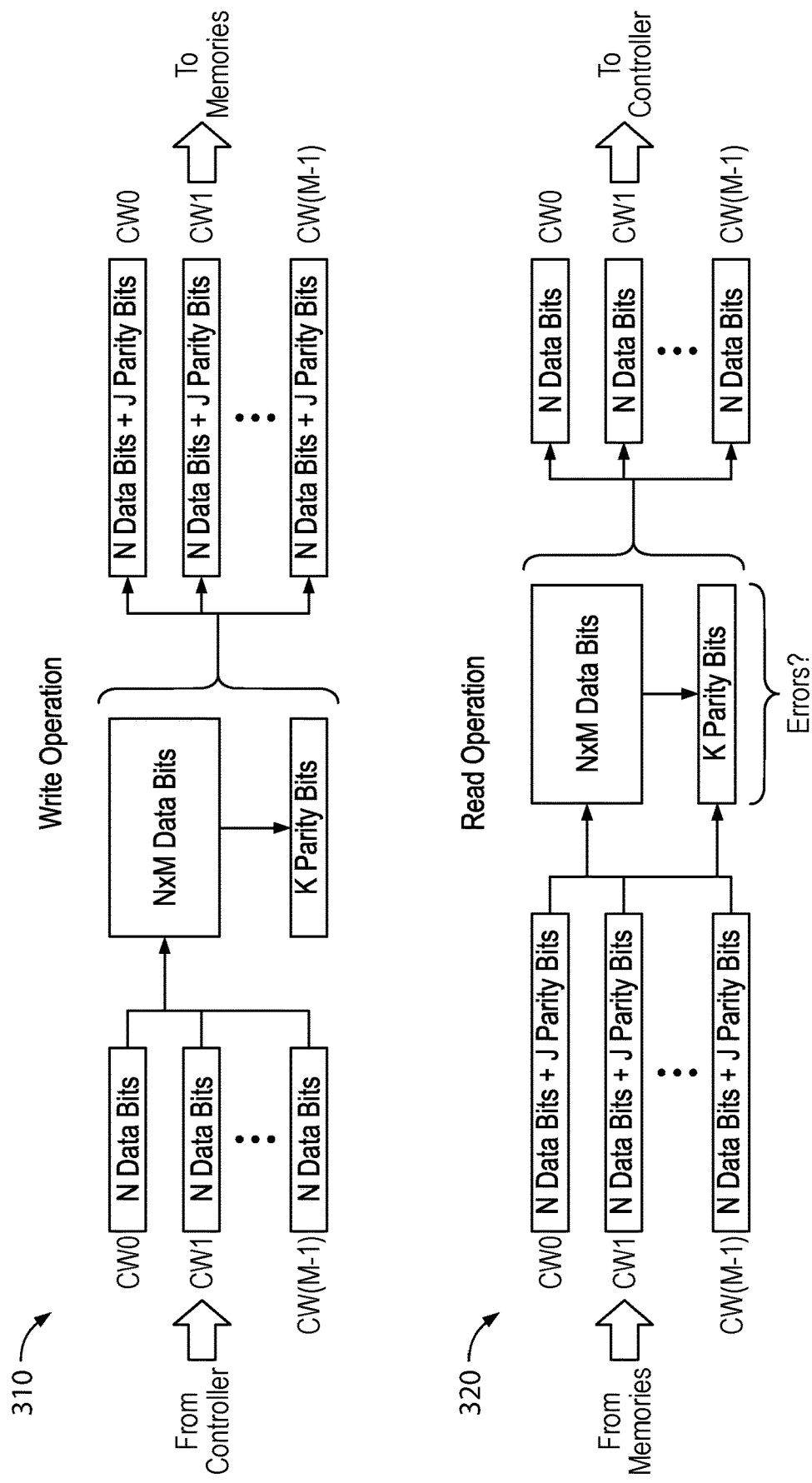
FIG. 3 is a block diagram of example read and write operations according to some embodiments of the present disclosure.

FIG. 3 is a block diagram of example read and write operations according to some embodiments of the present disclosure. The example write operation 310 and read operation 320 of FIG. 3 may, in some embodiments, be performed by the memory module 100 of FIGS. 1 and/or 200 of FIG. 2. For the sake of explanation, FIG. 3 will be described with respect to the components of FIG. 2.

In an example write operation 310, a set of codewords are received at the external data terminals from the controller and provided through the I/O circuit 234 to the ECC circuit 250. For example, there may be multiple sets of DQ terminals (e.g., one for each memory of the channel 202) each which receives a codeword in series across multiple DQ terminals (e.g., 16 DQ terminals in the example of FIG. 2). For example, each of the terminals receives a burst of data bits in series, and the bursts across all the terminals in a set make up the codeword. Each of the received codewords includes N data bits, and there may be M codewords, one for each of the memory devices in a channel 202.

The codewords are provided to the I/O circuit 260 of the ECC circuit 250, and stored in the input buffer 262 while the deserializer circuit 264 converts the codewords to a parallel format. The parallelized data bits from the codewords are provided to the logic tree 252 which generates parity bits based on the codewords. In other words, the ECC circuit 250 receives a pool of N×M data bits from the M codewords. For example, if each codeword included 128 data bits, and there are 5 memory devices per channel, then 640 data bits may be received. Based on the pooled data bits, the ECC circuit 250 generates K parity bits. For example, the ECC circuit 250 may generate 40 parity bits based on the 640 data bits. The manner in which the parity bits are generated may be based, in part, on the detection/correction scheme implemented by the ECC circuit. Different detection/correction schemes are discussed in more detail herein.

The K parity bits may be based on data bits from multiple of the codewords (e.g., the codewords from multiple memories of the channel 202). For example, at least some of the parity bits may have a value based on data bits in at least two of the codewords.

The parity bits may be divided into portions for storage in the different memories of the channel 202. For example, if K overall parity bits are generated, and there are M memories per channel, then J=K/M parity bits may be stored per memory. For example, if there are 40 parity bits and 5 memories per channel, then each written codeword may include 8 parity bits. The parity bits may pass through the serializer 264 and be divided between the original codewords to generate new codewords for writing to the channel 202. Each of these new codewords may include a set of N data bits (e.g., the original N data bits received from the controller) as well as a set of J parity bits. The J parity bits in a given codeword may be based on a set of data bits which may include data bits in the codeword it is appended to, but also data bits in one or more of the other codewords. Depending on the specific implementation, in some embodiments, the parity bits may not be based on any of the data bits in the codeword it is appended to.

Considering a single memory, the ECC circuit may receive a codeword of N data bits intended for that memory. The ECC circuit may generate a set of parity bits based on a pool of data bits (e.g., N×M data bits) across multiple codewords. The ECC circuit may then generate a new codeword which includes both the N data bits and a set of J parity bits. The N data bits are transmitted over a data bus 224 to the memory, while the J parity bits are transmitted over a parity bus 226. For example, if a burst length of 8 is used, and there are 128 data bits and 8 parity bits in the codeword written to the memory, then a single burst may be written across 16 data buses and 1 parity bus. The codeword, including the N data bits and J data bits may be stored in a memory array 212 of the memory device 210.

The example read operation 320 involves reading a set of codewords from the memory devices in a channel. Responsive to a read command, each memory in the channel (e.g., 202 of FIG. 2) provides a codeword at the data and parity terminals of that memory along the data bus 224 and parity buts 226 respectively. The codeword may be provided as serial data across the lines of the buses. For example, if a burst length of 8 is used, then 16 data bus lines and 1 parity bus line may transmit 128 data buts and 8 parity bits.

The ECC circuit 250 receives the M codewords along M data buses and M parity buses at the I/O circuit 260. The I/O buffer may receive the serial information so that the deserializer 264 can deserialize the N×M data bits and the K parity bits. The logic tree 252 may process the N×M data bits in a manner analogous to how the K parity bits were generated in the write operation. For example, each of the K parity bits may be generated based on various combinations of XORing the N×M data bits. The output of the logic tree 252 is provided to the comparator 254 which compares the output of the logic tree 252 to the K parity bits. Differences may indicate errors. Based on the output of the comparator 254, one or more error detection signals may be provided. If error correction is used, then the data bit(s) which include errors may be identified and their states may be inverted to correct the error. If error detection is used, then a signal may be generated to indicate that there is an error present. The serialized data is provided to the I/O circuit 234 and through those to the external data terminals of the module as a set of M codewords, each with N data bits (e.g., the N data bits read from each of the M memories of the channel).

Example ECC Implementations

The module-level ECC circuit (e.g., 114 of FIGS. 1 and/or 250 of FIG. 2) may be used to implement one or more error correction/detection schemes. In some embodiments, which scheme is used may be a selectable feature (e.g., based on a setting of the module settings, such as 112 of FIGS. 1 and/or 232 of FIG. 2). Different schemes may be implemented based, in part, on how parity bits are generated processed by a logic tree (e.g., 252) of the ECC circuit. Table 1 shows an example of potential detection/correction schemes which may be implemented in an example embodiment where the ECC circuit receives 640 data bits and 40 parity bits. Various other schemes may also be implemented.

TABLE 1

Example ECC Implementations

| Correction Scheme | Detection Scheme | Comments |
|---|---|---|
| SECDED | SECDED | Overprovisioning |
| DEC | CRC20 | Correct 2 bits and detect MBE |
| TEC | CRC10 | Correct 3-bit errors |

A single error correction, double error detection (SECDED) scheme may be used to locate and correct a single bit of error in the pooled data bits, and detect an additional bit of error (although not which bits are in error) for a total of two detected errors. There may be certain patterns of errors in the data bits which the SECDED scheme does not detect well on its own. However, the SECDED scheme also does not use all of the parity bits, which may allow for overprovisioning to catch additional patterns of error by running multiple implementations of SECDED. For example, a SECDED implementation may use 11 bits of parity. Since there are 29 bits leftover, two additional SECDED implementations could be used, to increase the coverage of the patterns of errors which can be detected.

A double error correction (DEC) scheme may be used to locate and correct up to two bits of error in the pooled data. The double error correction may use fewer than all of the parity bits. For example, the DEC may use 20 bits parity. Accordingly, there may be 'extra' parity bits which may be used for the detection of multi-bit errors (MBE). For example, along with the DEC error correction, a cyclic redundancy check (CRC) may be implemented using the remaining parity bits. For example, if the DEC uses 20 parity bits, and there are 40 total parity bits, then a CRC20 may be implemented. The CRC20 may detect multi-bit errors (MBEs).

A triple error correction (TEC) scheme may be used to locate and correct up to three errors in the pooled data. Similar to the DEC discussed above, the TEC may use fewer than all of the parity bits. For example, the TEC may use 30 parity bits. Accordingly, there may be 'extra' parity bits which may be used for the detection of multi-bit errors. For example, along with the TEC error correction, a CRC may be implemented using the remaining parity bits. For example, if the TEC uses 30 parity bits, and there are 40 total parity bits, then a CRC10 may be implemented.

Each of the ECC schemes discussed above may correct increasing numbers of errors at the cost of increased latency (e.g., increased processing required to locate the errors). For example, a TEC scheme may require a more elaborate logic tree than the SECDED scheme. Accordingly, the module may make which ECC scheme is used a selectable feature. This may allow a customer to choose whether the trade-off between latency and increased numbers of errors to detect is worth it. For example, a setting in the module settings may determine which scheme is used. Based on which scheme is selected, how the data is input to the logic tree and which logic gates are used may be changed to accommodate the different ECC schemes.

Figure 4:
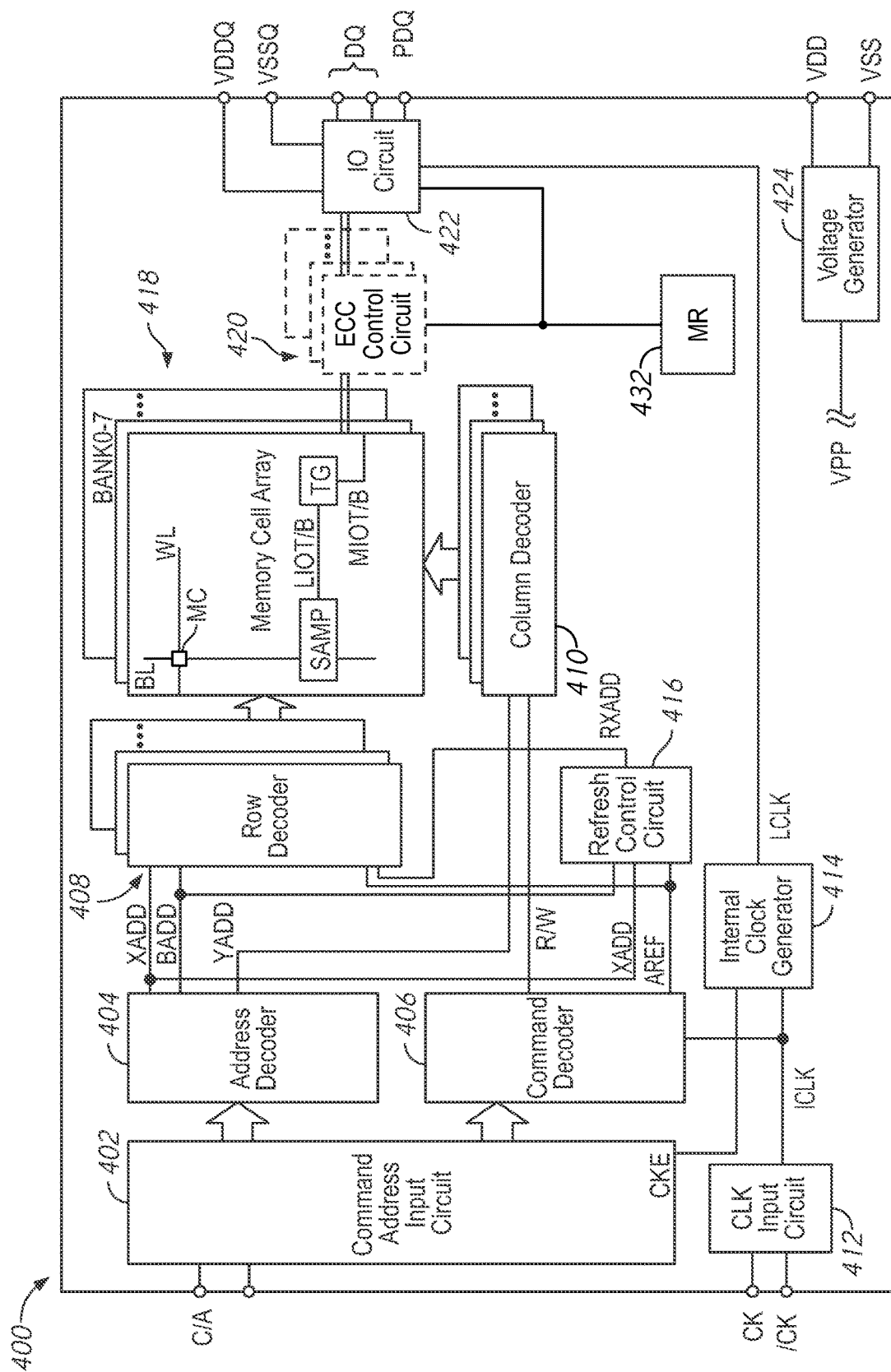
FIG. 4 is a block diagram of a semiconductor device according an embodiment of the disclosure.

FIG. 4 is a block diagram of a semiconductor device according an embodiment of the disclosure. The semiconductor device 400 may be a semiconductor memory device, such as a DRAM device integrated on a single semiconductor chip. The memory device 400 may, in some embodiments, implement the memory dies 122, 126, 132, and/or 136 of FIGS. 1 and/or 210 of FIG. 2. The memory device 400 of FIG. 4 has various external terminals (e.g., data terminals DQ, parity data terminals PDQ, command/address terminals, etc.) which may be coupled to buses within the module. Module logic of the module may send/receive information to an external controller and route signals along the buses to the terminals of the memory device 400.

The semiconductor device 400 includes a memory array 418. The memory array 418 is shown as including a plurality of memory banks. In the embodiment of FIG. 1, the memory array 418 is shown as including eight memory banks BANK0-BANK7. More or fewer banks may be included in the memory array 418 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 408 and the selection of the bit lines BL is performed by a column decoder 140. In the embodiment of FIG. 1, the row decoder 408 includes a respective row decoder for each memory bank and the column decoder 410 includes a respective column decoder for each memory bank. The bit lines BL are coupled to a respective sense amplifier (SAMP). Read data from the bit line BL is amplified by the sense amplifier SAMP, and transferred to IO circuits 422 through complementary local data lines (LIOT/B), transfer gate (TG), and complementary main data lines (MIOT/B). The information may be coupled between the TG and IO circuit 122 via an optional ECC circuit 420 in some embodiments. Conversely, write data outputted IO circuit 422 is transferred to the sense amplifier SAMP (optionally through ECC circuit 420) over the complementary main data lines MIOT/B, the transfer gate TG, and the complementary local data lines LIOT/B, and written in the memory cell MC coupled to the bit line BL.

The semiconductor device 400 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 412. The external clocks may be complementary. The input circuit 412 generates an internal clock ICLK based on the CK and /CK clocks. The ICLK clock is provided to the command decoder 406 and to an internal clock generator 414. The internal clock generator 414 provides various internal clocks LCLK based on the ICLK clock. The LCLK clocks may be used for timing operation of various internal circuits. The internal data clocks LCLK are provided to the input/output circuit 422 to time operation of circuits included in the input/output circuit 422, for example, to data receivers to time the receipt of write data.

The C/A terminals may be supplied with memory addresses. A controller may provide the addresses to CA terminals of the module (e.g., 100 of FIG. 1) and module logic (e.g., 110 of FIG. 1) may route that CA information to the CA terminals of the selected memory device. The memory addresses supplied to the C/A terminals are transferred, via a command/address input circuit 402, to an address decoder 404. The address decoder 404 receives the address and supplies a decoded row address XADD to the row decoder 408 and supplies a decoded column address YADD to the column decoder 410. The address decoder 404 may also supply a decoded bank address BADD, which may indicate the bank of the memory array 418 containing the decoded row address XADD and column address YADD. The C/A terminals may be supplied with commands, also through the memory module logic. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 406 via the command/address input circuit 402. The command decoder 406 includes circuits to decode the internal command signals to generate various internal signals and commands for performing operations. For example, the command decoder 406 may provide a row command signal to select a word line and a column command signal to select a bit line.

The device 400 may receive an access command which is a read command. When a read command is received, and a bank address, a row address and a column address are timely supplied with the read command, a codeword including read data and read parity bits is read from memory cells in the memory array 418 corresponding to the row address and column address. The read command is received by the command decoder 406, which provides internal commands so that read data from the memory array 418 is provided to the I/O circuit 422. The I/O circuit 422 provides the read data bits to a data bus (e.g., 224 of FIG. 2) from DQ terminals of the device, and provides the read parity bits to a parity bus (e.g., 226 of FIG. 2) from parity terminals PDQ of the device. The manner in which the I/O circuit 422 provides the signals (e.g., burst length, number of DQ terminals to use, binary or multi-level signaling, etc.) may be determined by a setting in a mode register 432.

In some embodiments, the memory device 400 includes an optional memory-level ECC circuit 420 (e.g., 216 of FIG. 2). If the ECC circuit 420 is enabled by the mode register 432, then the ECC control circuit 420 may use the data bits and the parity bits in the read codeword to determine if the codeword includes any errors, and if any errors are detected, may correct them to generate a corrected codeword (e.g., by changing a state of the identified bit(s) which are in error). The corrected codeword (without the parity bits) is output to outside the device 400 from the data terminals DQ via the input/output circuit 422.

The device 400 may receive an access command which is a write command. When the write command is received, and a bank address, a row address, and a column address are timely supplied as part of the write operation, and write data is supplied through the DQ terminals to the I/O circuit 422 along with parity data provided along the parity terminals PDQ. The write data and write parity bits is supplied to the data terminals DQ is written to a memory cells in the memory array 418 corresponding to the row address and column address. The write command is received by the command decoder 406, which provides internal commands so that the write data is received by data receivers in the input/output circuit 422. Write clocks may also be provided to the external clock terminals for timing the receipt of the write data by the data receivers of the input/output circuit 422.

In embodiments where the ECC circuit 420 is enabled by the mode register 432, the memory device 400 receives write data, but not parity. The write data is supplied via the input/output circuit 422 to the ECC control circuit 420. The ECC control circuit 420 may generate a number of parity bits based on the write data, and the write data and the parity bits may be provided as a codeword to the memory array 418 to be written into the memory cells MC.

When it is enabled, the ECC control circuit 420 may be used to ensure the fidelity of the data read from a particular group of memory cells to the data written to that group of memory cells. The device 400 may include a number of different ECC control circuits 420, each of which is responsible for a different portion of the memory cells MC of the memory array 418. For example, there may be one or more ECC control circuits 420 for each bank of the memory array 418.

The mode register 432 includes various settings, stored in registers. The different registers may be used for various features, such as to adjust the operation of the device 400, providing information about the operation of the device, enabling or disabling various features of the device 400 and so forth. For example, in embodiments where the memory device 400 includes an ECC circuit 420, the mode register 432 may include an ECC enable register which stores an ECC enable value. If the ECC enable value is active, then the ECC circuit 420 may be enabled, and ECC operations may be performed on the memory device 400. If the ECC enable value is inactive, then the ECC circuit 420 may be disabled, and the data bits and parity bits may be transmitted off the memory device 400 (e.g., using the DQ terminals and the parity terminals PDQ).

The mode register 432 may also include various registers which manage how the I/O circuit 422 operates. For example, the mode register 432 may include registers which specify how many of the DQ terminals should be used for sending/receiving data. Similarly, the mode register 432 may include registers which specify a burst length expected along the DQ terminals and PDQ terminals. The mode register 432 may also include registers which specify if binary or multi-level signaling should be used along the data bus and/or parity bus. These register values may match values in corresponding registers of the module settings (e.g., 112 of FIGS. 1 and/or 232 of FIG. 2) so that the both the memory device 400 and module logic use corresponding settings for sending and receiving data and parity along the data bus and parity bus.

The device 400 may also receive commands causing it to carry out one or more refresh operations as part of a self-refresh mode. In some embodiments, the self-refresh mode command may be externally issued to the memory device 400. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 406 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 416. The refresh control circuit 416 supplies a refresh row address RXADD to the row decoder 408, which may refresh one or more wordlines WL indicated by the refresh row address RXADD.

The power supply terminals are supplied with power supply potentials VDD and VSS. The power supply potentials VDD and VSS are supplied to an internal voltage generator circuit 424. The internal voltage generator circuit 424 generates various internal potentials VPP, VOD, VARY, VPERI, and the like based on the power supply potentials VDD and VSS supplied to the power supply terminals. The internal potential VPP is mainly used in the row decoder 408, the internal potentials VOD and VARY are mainly used in the sense amplifiers SAMP included in the memory array 418, and the internal potential VPERI is used in many peripheral circuit blocks.

The power supply terminals are also supplied with power supply potentials VDDQ and VSSQ. The power supply potentials VDDQ and VSSQ are supplied to the input/output circuit 422. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 422 so that power supply noise generated by the input/output circuit 422 does not propagate to the other circuit blocks.

Figure 5:
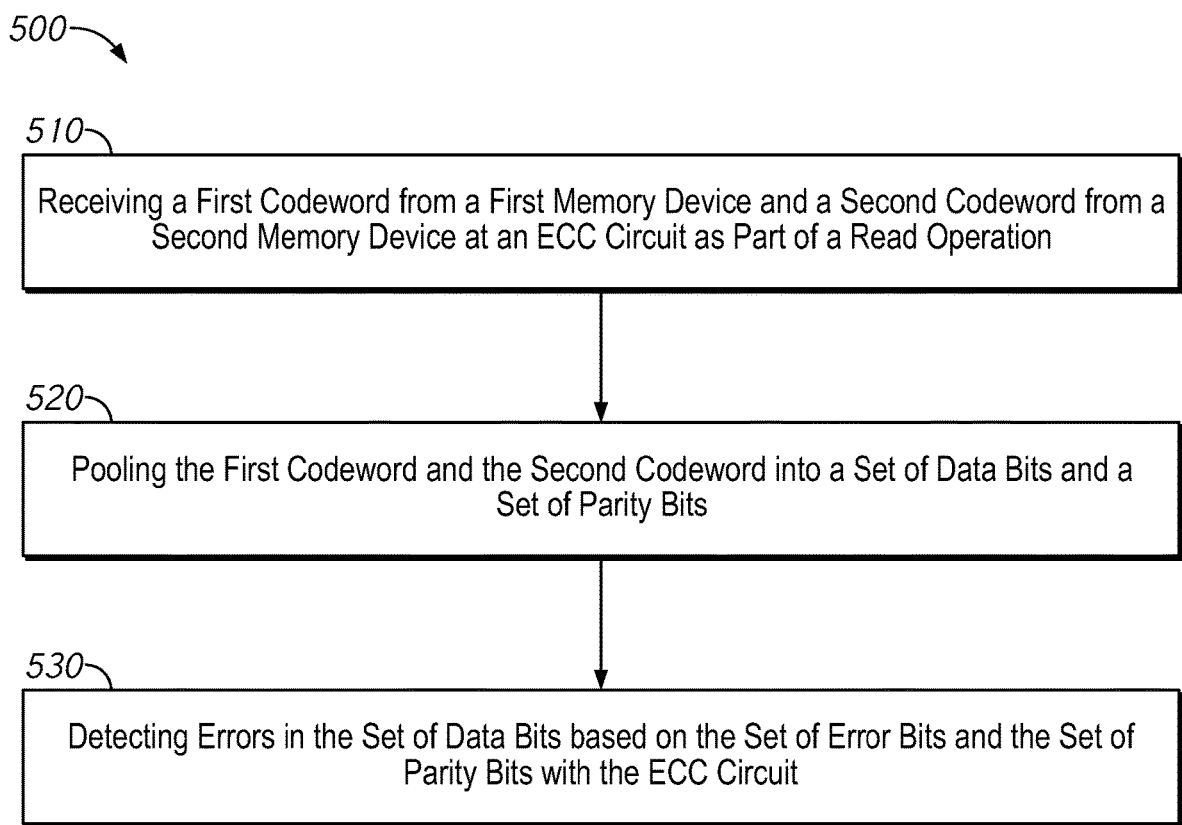
FIG. 5 is a flow chart of a method according to some embodiments of the present disclosure.

FIG. 5 is a flow chart of a method according to some embodiments of the present disclosure. The method 500 may represent a method of performing ECC operations based on pooled data and parity from multiple memories of a module. The method 500, may, in some embodiments, be implemented by any of the apparatuses and/or systems described herein, such as the memory modules 100 of FIGS. 1 and/or 200 of FIG. 2.

The method 500 may begin with block 510, which describes receiving a first codeword from a first memory device and a second codeword from a second memory device as part of a read operation. For example, the method 500 may include receiving a command, such as a read command, along with address information which specifies a channel of the memory which includes the first memory device and the second memory device (e.g., memories 122 and 126 of FIG. 1). The method 500 may include receiving the command at an external CA terminal of the module (e.g., 104 of FIG. 1) and routing the command via module logic (e.g., 110 of FIG. 1), which may act as a buffer of the module. The method 500 may include, responsive to the command, reading data bits and parity bits from a memory array of the first memory device to form the first codeword (including the data bits and parity bits) and reading data bits and parity bits from a memory array of the second memory device to form the second codeword (including data bits and parity bits). The method 500 may include providing data bits of the first codeword and data bits of the second codeword along a data bus (e.g., 224 of FIG. 2) and providing parity bits of the first codeword and parity bits of the second codeword along a parity bus (e.g., 226 of FIG. 2).

The method 500 includes block 520, which describes pooling the first codeword and the second codeword into a set of data bits and a set of parity bits. For example, an ECC circuit (e.g., 114 of FIG. 1) on the module logic may receive the first and the second codewords together. The set of data bits includes data bits from the first codeword and the second codeword (e.g., from the first memory and the second memory) and the set of parity bits includes parity bits from the first codeword and the second codeword (e.g., from the first memory and the second memory). The method 500 may include deserializing the first codeword and the second codeword at the module logic.

The method 500 includes block 530, which describes detecting errors in the set of data bits based on the set of error bits and the set of parity bits. The method 500 may include performing a ECC operation on the pooled set of data bits and the pooled set of parity bits. For example, one of the ECC implementations described in Table 1, above, may be used. Depending on the implementation used, the ECC circuit may detect errors in the pooled information, in which case the method 500 may include providing a signal to indicate that an error was detected, and/or the ECC circuit may correct errors in the pooled information, for example the method 500 may include correcting at least one of the set of data bits.

In some embodiments, the method 500 may include receiving a first codeword which includes first data bits and a second codeword which includes second data bits as part of a write operation. The method 500 may include pooling the first and the second data bits and generating parity bits based on the first and the second data bits. The method 500 may include dividing the parity bits into first parity bits and second parity bits, and then generating a first codeword including the first data bits and the first parity bits and a second codeword including the second data bits and the second parity bits. The method 500 may include writing the first codeword to a first memory device and writing the second codeword to a second memory device.

Example Intra-Device Signalling Protocols

In some embodiments, the use of a module level ECC circuit (e.g., 114 of FIGS. 1 and/or 250 of FIG. 2) may be a potential source of increased latency. For example, since the data and parity bits are pooled on the memory module, the module logic must receive and deserialize the data and parity bits before they are processed by the ECC circuit. In order to mitigate this problem, various strategies may be used, such as increasing the rate at which data is provided along the internal data bus between the memory devices and the module logic. In that manner, the module logic may operate at a speed (e.g., receive bits) faster than a rated speed at which the device needs to provide information to the outside world (e.g., to the external DQ terminals).

Figure 6:
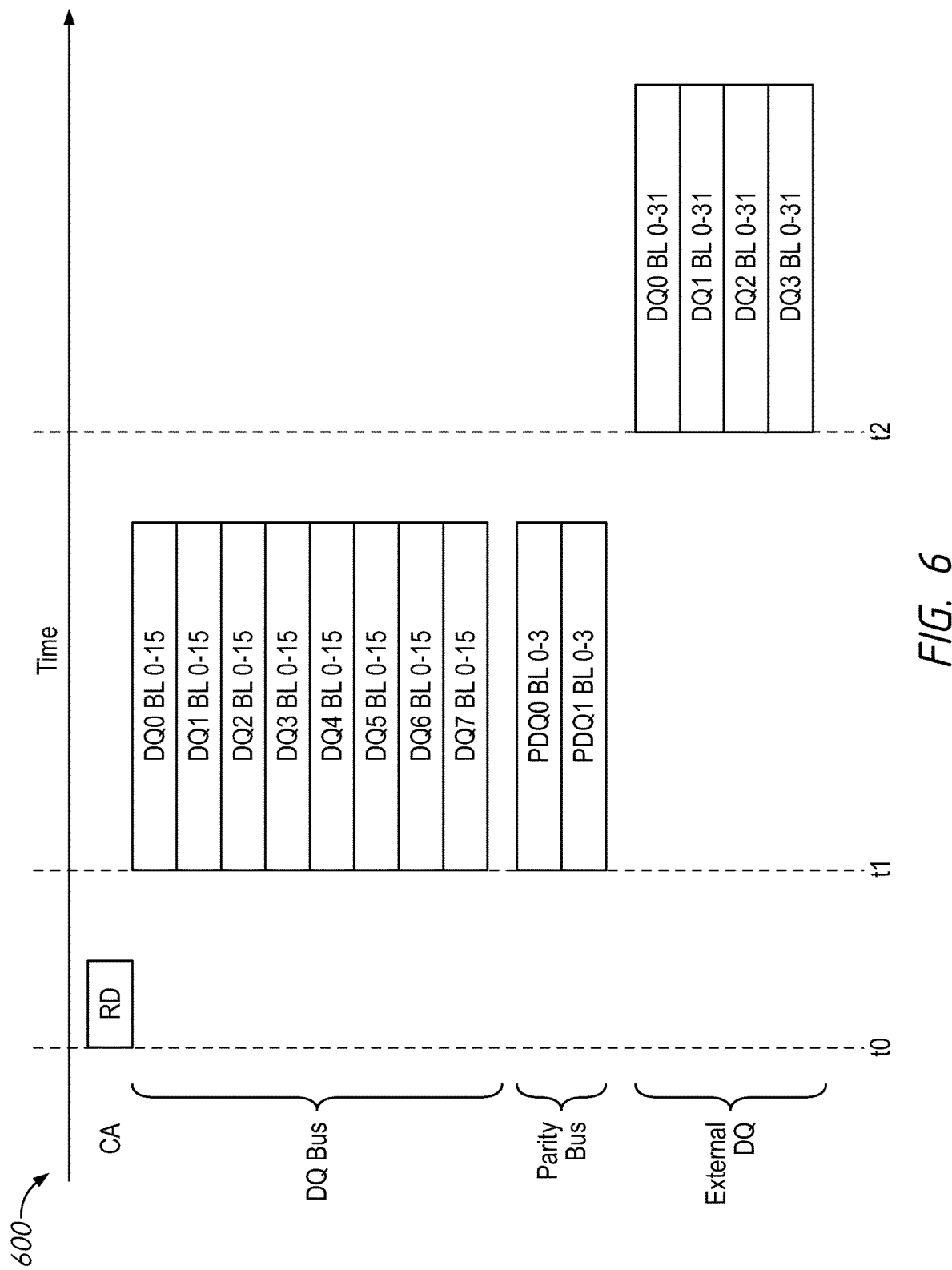
FIG. 6 is a timing diagram of an example read operation in a memory module where a signaling protocol is used where more data bus lines than external data terminals are used.
Figure 7:
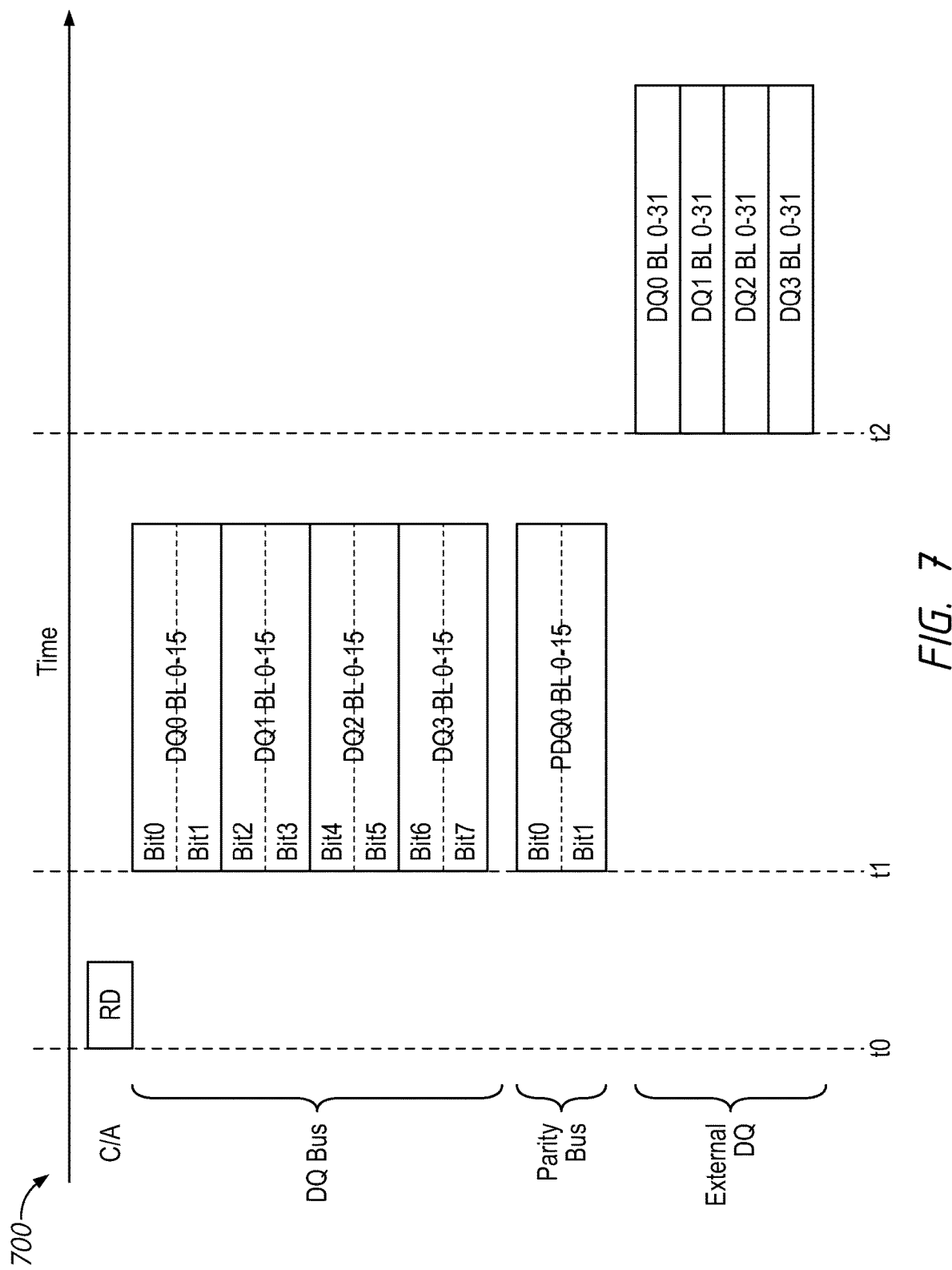
FIG. 7 is a timing diagram of an example read operation in a memory module where a signaling protocol is used multi-level signaling along the data bus.

FIGS. 6 and 7 each describe different signaling protocols which may be used along the data bus lines (and/or parity bus lines) in more detail. The signaling protocol may be a selectable feature of the module. For example, a module settings register (e.g., 112 of FIG. 1) may store settings related to the signaling protocol to be used. The mode registers (e.g., 124 of FIG. 1) of the memory devices may also store information related to the signaling protocol.

FIG. 6 is a timing diagram of an example read operation in a memory module where a signaling protocol is used where more data bus lines than external data terminals are used. The timing diagram 600 may represent operations in a memory module such as the module 100 of FIGS. 1 and/or 200 of FIG. 2. The timing diagram 600 represents a simplified schematic view for illustrative purposes and, for example, the timing of various aspects is not necessarily to scale. The timing diagram 600 represents operations of a single memory device's worth of information, however, in an actual module multiple memory devices would be accessed at once.

The timing diagram shows a read command received along a CA bus at an initial time t0. The read command is provided to a memory device (e.g., 210 of FIG. 2), which retrieves data bits and parity bits from the memory array. At a first time t1, the memory begins providing a codeword including the data bits and the parity bits along a data bus (e.g., 224 of FIG. 2) and parity bus (e.g., 226) of FIG. 2) to the module ECC circuit (e.g., 250 of FIG. 2). At a second time t2, the module provides the (corrected) data bits as part of a codeword off the module via external DQ terminals.

In the example embodiment of FIG. 6, the memory module may operate in an x4 mode, where 4 external data terminals are used for each memory device. Along with a burst length of 32, this means that a total of 128 data bits are provided as a codeword along 4 DQ terminals (e.g., 102 of FIG. 1).

More data bus lines may be used than external data terminals are used to increase the speed at which the data and parity bits are provided from the memory device to the module ECC circuit. In the example embodiment of FIG. 6, double the number of data bus lines are used compared to the number of external data terminals. Accordingly, 8 data bus lines are used, each with a burst length of 16, to transmit the 128 data bits of the codeword. Other arrangements may also be used, for example, 16 data bus lines may be used (with a burst length of 8). Ratios of external DQ terminals to internal data bus channels other than powers of two may also be used.

In the example embodiment of FIG. 6, two parity bus lines are used, each with a burst length of 4, for a total of 8 parity bits, however other arrangements of parity bus signaling protocol may be used.

The increase in the number of data bus lines may allow the ECC circuit to operate faster, in terms of bits received per clock cycle, than the speed at which the module operates with respect to the outside world. This may allow the ECC circuit to receive and process information at a higher speed which may mitigate the additional latency added by the ECC circuit.

FIG. 7 is a timing diagram of an example read operation in a memory module where a signaling protocol is used multi-level signaling along the data bus. The timing diagram 700 may represent operations in a memory module such as the module 100 of FIGS. 1 and/or 200 of FIG. 2. The timing diagram 700 represents a simplified schematic view for illustrative purposes and, for example, the timing of various aspects is not necessarily to scale. The timing diagram 700 represents operations of a single memory device's worth of information, however, in an actual module multiple memory devices would be accessed at once.

The timing diagram shows a read command received along a CA bus at an initial time t0. The read command is provided to a memory device (e.g., 210 of FIG. 2), which retrieves data bits and parity bits from the memory array. At a first time t1, the memory begins providing a codeword including the data bits and the parity bits along a data bus (e.g., 224 of FIG. 2) and parity bus (e.g., 226) of FIG. 2) to the module ECC circuit (e.g., 250 of FIG. 2). At a second time t2, the module provides the (corrected) data bits as part of a codeword off the module via external DQ terminals.

In the example embodiment of FIG. 7, the memory module may operate in an x4 mode, where 4 external data terminals are used for each memory device. Along with a burst length of 32, this means that a total of 128 data bits are provided as a codeword along 4 DQ terminals (e.g., 102 of FIG. 1).

The data bus lines may use multi-level signaling, in contrast to the binary signaling along the external DQ terminals. For example, the external terminals may use two voltage levels to represent a logical low and a logical high value. The data bus lines may use more than two voltage levels to represent the states of multiple bits at the same time. In the example embodiment of FIG. 7, PAM4 signally is used, where each burst along the data bus lines has four possible levels, to represent the states of two bits at the same time. For example if the two bits have a state of 00, a first level may be used, 01 may be a second level, 10 may be a third level, and 11 may be a fourth level. Other multi-level signally protocols may be used in other embodiments.

As with FIG. 6 above, the multi-level signaling may allow a shorter burst length (e.g., less time) along the data bus to convey the same amount of data bits per codeword as are provided at the external terminals. For example, with PAM4 signaling, each data bus line may represent 2 bits simultaneously. Accordingly, while a same number of data bus lines as external DQ terminals are used, the total burst length in the data bus is halved compared to at the external DQ terminals.

In the example embodiment of FIG. 7, a single parity bus line is shown which also uses multi-level signalling, however other arrangements of parity bus signaling protocol may be used.

The increase in bits per burst from multi-level signalling may allow the ECC circuit to operate faster, in terms of bits received per clock cycle, than the speed at which the module operates with respect to the outside world. This may allow the ECC circuit to receive and process information at a higher speed which may mitigate the additional latency added by the ECC circuit.

In some embodiments, increased data bus use and multi-level signaling (e.g., as described in FIGS. 6-7) may be used together. For example, there may be more data bus lines in use than external DQ terminals, and the data bus lines may use multi-level signaling. In an example embodiment where the external DQ uses 4 DQ terminals, each with a burst length of 32, the internal data bus may use 8 lines, each using PAM4 signaling for a burst length of 8.

Figure 8:
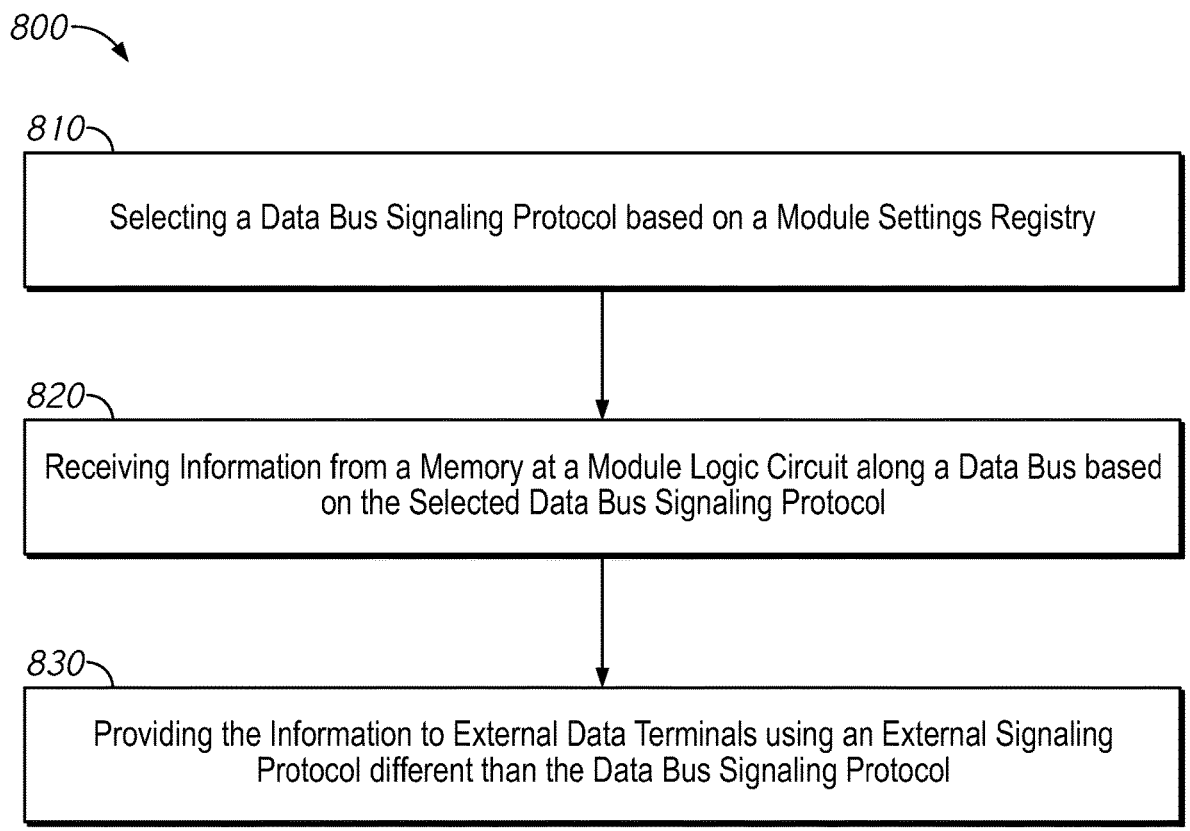
FIG. 8 is a method flow chart of a method of selecting a data bus signalling protocol according to some embodiments of the present disclosure.

FIG. 8 is a method flow chart of a method of selecting a data bus signalling protocol according to some embodiments of the present disclosure. The method 800 may, in some embodiments, be implemented by one or more of the apparatuses and/or systems described herein, such as the modules 100 of FIGS. 1 and/or 200 of FIG. 2.

The method 800 includes block 810, which describes selecting a data bus signaling protocol based on a module settings registry. The module settings register (e.g., 112 of FIGS. 1 and/or 232 of FIG. 2) may include one or more registries associated with the signalling protocol. For example, the method 800 may include setting a burst length, enabling a number of data bus lines, and/or enabling a multi-level signalling protocol as part of selecting the data bus signalling protocol. The method 800 may include selecting the data bus signalling protocol based on settings in the module settings registry and in the mode registers of the module's memory devices.

The method 800 includes block 820, which describes receiving information from a memory at a module logic circuit along a data bus based on the selected data bus signaling protocol. The method 800 may include receiving data along the data bus and receiving parity bits along a parity bus. The method 800 may include providing the information to external data terminals using an external signaling protocol different than the data bus signaling protocol. For example, the method 800 may include providing the data with a longer burst length at the external data terminals.

In some embodiments, the method 800 may include receiving data at the data terminals based on the external signalling protocol and providing the received data along the data bus based on the data bus signalling protocol.

Example Sub-Divisions of ECC Pools

In some embodiments, the use of a module level ECC circuit (e.g., 114 of FIGS. 1 and/or 250 of FIG. 2) may be a source of potential increased latency. For example, since the data and parity bits are pooled on the memory module, the module logic must receive and deserialize the data and parity bits before they are processed by the ECC circuit. In order to mitigate or prevent this problem, various strategies may be used to increase the efficiency of the ECC circuit processing the information.

For example, the ECC circuit may split the incoming data and parity bits into portions, and process each portion separately. This may offer advantages, both in terms of allowing the ECC circuit to pipeline the data (e.g., to begin processing a first portion while a second is still arriving at the input buffer), as well as reducing the size of the block of data and parity that must be processed, which in turn may reduce the number of logic gates in the logic tree of the ECC circuit (which in turn may decrease the size and increase the speed of the ECC circuit).

Figure 9:
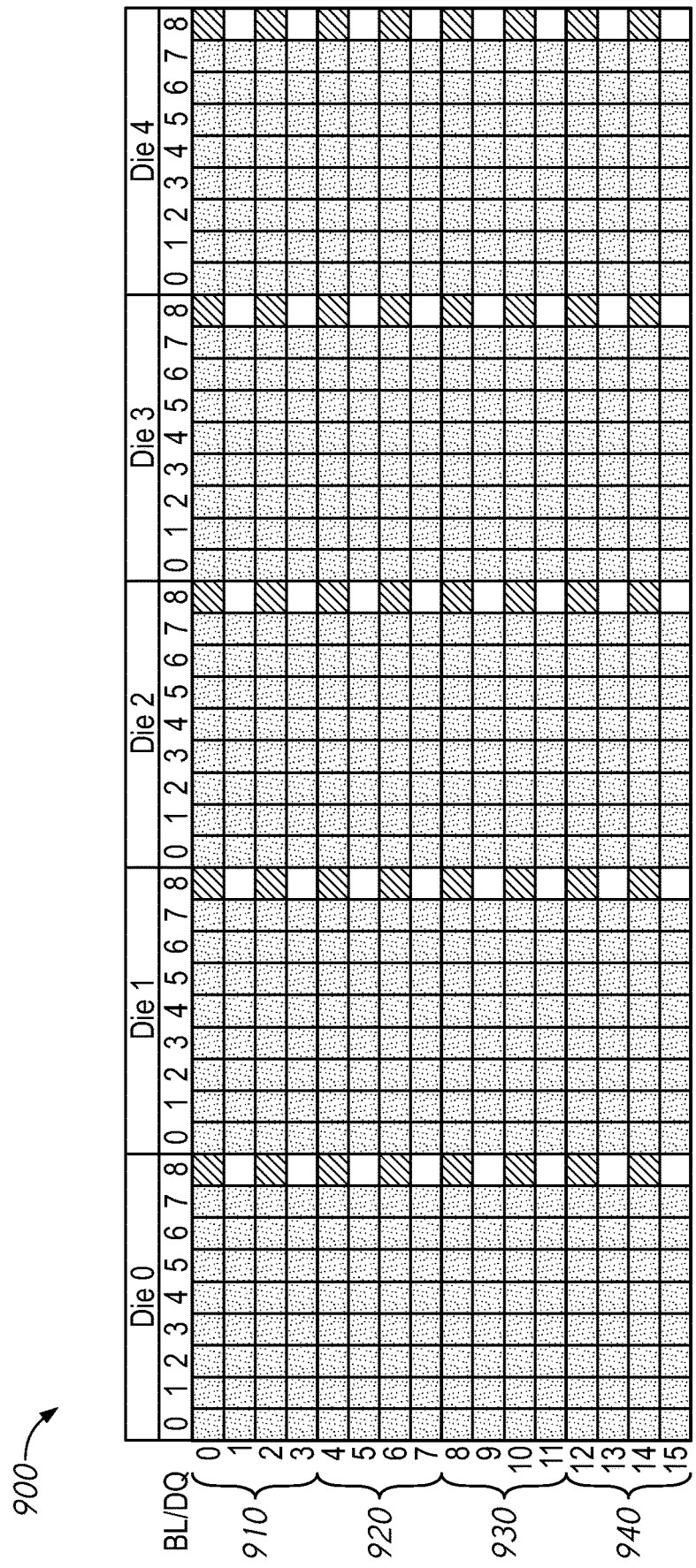
FIG. 9 is a table of an example of sub-dividing pooled data and parity according to some examples of the present disclosure.

FIG. 9 is a table of an example of sub-dividing pooled data and parity according to some examples of the present disclosure. The table 900 represents a set of data and parity bits which may be read out from the memory devices of a channel and how that data and parity may be processed. The table 900 may, in some embodiments, represent the data and parity in a set of codewords from a channel, such as the channel 120 or 130 of FIG. 1 and/or the channel 202 of FIG. 2. The table 900 shows a set of data bits and parity bits transmitted to or from a set of memories of a channel as part of a read or write operation. The table 900 is organized with rows representing serial transmission (e.g., in a burst) and columns representing parallel transmission (e.g., along different signal lines). The columns have been organized in sets, each representing the data and parity buses associated with a memory of the channel.

The table 900 represents an example embodiment where each memory provides a codeword with 128 data bits and 8 parity bits. Each codeword includes data provided along 8 signal lines of a data bus (e.g., 224 of FIG. 2) and 1 signal line of a parity bus (e.g., 226 of FIG. 2) per memory. The table 900 also represents an embodiment where there are 5 memories per channel, for a total of 640 data bits along 40 total data bus lines and 40 parity bits along 5 parity bus lines. The example embodiment of FIG. 9 uses a burst length of 16 bits per signal line (8 bits along the parity bus lines). In other words, with each rising or falling edge of a clock (e.g., 8 total clock cycles) a different bit may be latched from the bus.

Since there are fewer parity bits than there are burst length, (e.g., a burst length of 16 but only 8 parity bits per memory), then only some of the bursts along the parity signal lines may carry valid parity bits. For example, in the embodiment of FIG. 9, as indicated by the shaded boxes, every other burst (e.g., every other rising or falling edge of a clock) may carry a parity bit. Different arrangements of data, signal lines, burst length, etc. may be used in other example embodiments.

In the embodiment of FIG. 9, the ECC circuit may process the information by sub-dividing the pooled data into different portions, 910-940. In the embodiment of FIG. 9, four different portions 910-940 are used, although more or fewer portions may be used in other example embodiments. Each portion may represent a portion of the burst length along each of the data and parity bus lines which are transferring data to the ECC circuit. In the example of FIG. 9, where a burst length of 16 is used, each portion 910-940 includes a burst of four. In other words, serial bits 0-3 along the 40 data bus lines (8 per memory) and 5 parity bus lines (1 per memory) are part of a first portion 910. For example, if both rising and falling edges of clock cycle are used to latch data, the first portion 910 includes a first set of bits along all forty data bus lines and the parity bus lines latched on a first edge of the clock signal, a second set of bits along all forty data bus lines (but not the parity bus lines) latched on a second edge of the clock signal, a third set of bits along all forty data bus lines and the parity bus lines latched on a third edge of the clock signal, and a fourth set of bits along all forty data bus lines (but not the parity bus lines) latched on a fourth edge of the clock signal. In an analogous manner, the second portion 920 includes serial bits 4-7, the third portion 930 includes serial bits 8-11, and the fourth portion 940 includes serial bits 12-15.

The input/output buffer (e.g., 262 of FIG. 2) receives the bits of a portion, such as 710, along a set of signal lines in parallel. Once a number of clock edges have passed (e.g., four clock edges), the data and parity bits of the portion 910 are provided to the deserializer (e.g., 264) so that the bits may be deserialized. The deserialized bits are provided to the logic tree, which begins processing the bits of the portion 910. In some embodiments, pipelining may be used, where after the bits of the first portion 910 are provided to the deserializer, the I/O buffer is receiving the second portion 920, and so forth.

Accordingly, the logic tree (e.g., 252) receives and processes the bits of each portion separately. In this embodiment, each portion includes 160 data bits and 10 parity bits. These bits are pooled from the different memory devices in the channel. In other words, the bits in the portion such as 910 represent a portion of the bits in the codewords from each of the memories in a channel.

The ECC circuit may perform ECC operations on each separate portion of the pooled information. Various ECC implementations (e.g., as discussed in Table 1) may be used. For example, the ECC circuit may perform single error correction (SEC) on each portion 910-940, for a total of up to four errors which can be corrected (one in each portion). In some embodiments, the ECC circuit may alternatively, or in addition, also detect errors. For example, the ECC circuit may perform a multi-bit error detection such as a CRC8 detection scheme. In some embodiments, the ECC circuit may implement both error correction and detection (e.g., SEC and CRC8) on each portion.

Figure 10:
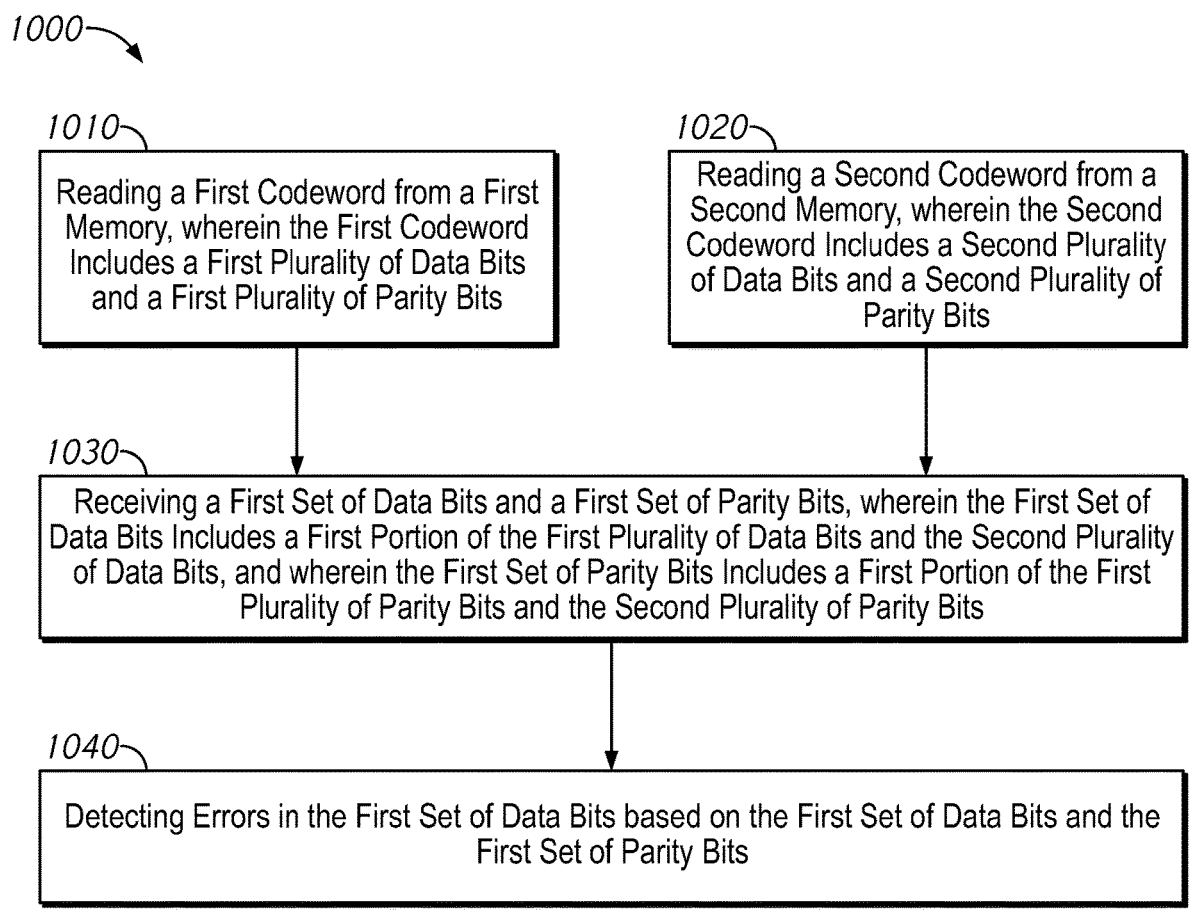
FIG. 10 is a flow chart of a method of sub-dividing pooled ECC information according to some embodiments of the present disclosure.

FIG. 10 is a flow chart of a method of sub-dividing pooled ECC information according to some embodiments of the present disclosure. The method 1000 of FIG. 10 may, in some embodiments, be implemented on one or more of the apparatuses and/or systems described herein, such as the memory modules 100 of FIGS. 1 and/or 200 of FIG. 2.

The method 1000 includes block 1010, which describes reading a first codeword from a first memory (e.g., 122 of FIG. 1). The first codeword includes a first plurality of data bits and a first plurality of parity bits. The method 1000 also includes block 1020, which describes reading a second codeword from a second memory (e.g., 126 of FIG. 1). The second codeword includes a second plurality of data bits and a second plurality of parity bits. The first and second codewords may be read as part of a same read operation. For example, the first and second memory devices may be part of a same channel (e.g., 120 of FIG. 1) on a memory module (e.g., 100 of FIG. 1). In some embodiments, the blocks 1010 and 1020 may happen at the same time.

The method 1000 may include providing the data bits of the first codeword along at least one data bus line (e.g., 224 of FIG. 2) as serialized data and providing the parity bits of the first codeword along at least one parity bus line (e.g., 226 of FIG. 2) as serialized parity bits. Similarly, the method 1000 may include providing the data bits of the second codeword along at least one data bus line as serialized data and providing the parity bits of the second codeword along at least one parity bus line as serialized parity bits.

The reading described in blocks 1010 and 1020 may generally be similar to the reading described with respect to block 510 of FIG. 5. In some embodiments, one or more of the signaling protocols described with respect to FIGS. 6-8 may be used. For the sake of brevity, information already described previously may not be repeated with respect to FIG. 10.

The method 1000 includes block 1030, which describes receiving a first set of data bits and a first set of parity bits. The first set of data bits includes a first portion of the first plurality of data bits from the first codeword and a first portion of the second plurality of data bits from the second codeword. The first set of parity bits includes a first portion of the first plurality of parity bits from the first codeword and a first portion of the second plurality of parity bits from the second codeword. For example, the method 1000 may include receiving the first and the second codewords as serialized data along multiple buses (data and parity buses) and the first portion may represent a portion of a burst length along each of those buses. For example, if the codeword is transmitted as a burst length of 16, then the first portion may involve capturing the first four bursts. In some embodiments, the first portion of the parity bits may be transmitted at a different rate than the first portion of the data bits. For example, the first portion of parity bits may include capturing bits along the parity buses at half the rate bits are captured from the data buses. In an example embodiment, such as the one described in FIG. 9, where 5 channels each provide data over 8 data bus lines each, and parity along 1 parity bus line each, the method 1000 may include capturing 4 bits along each of the data bus lines and 2 bits along each of the parity bus lines as the first portion (e.g., 910 of FIG. 9). The method 1000 may include setting a size of the first portion based on one or more settings in a module settings register (e.g., 112 of FIG. 1). The method 1000 may include deserializing the first set of data bits and the first set of parity bits (e.g., with deserializer 264 of FIG. 2).

The method 1000 includes block 1040, which describes detecting errors in the first set of data bits based on the first set of data bits and the first set of parity bits. For example, the ECC circuit may detect multi-bit errors (e.g., with a CRC8 scheme). In some embodiments, the ECC circuit may correct errors (e.g., with a SEC scheme). In some embodiments, both a detection and correction scheme may be used together.

The method 1000 may include receiving a second set of data bits and a second set of parity bits. For example, the second set of data bits may be a second portion of the first plurality of data bits from the first codeword and a second portion of the second plurality of data bits from the second codeword. The second set of parity bits includes a second portion of the first plurality of parity bits from the first codeword and a second portion of the second plurality of parity bits from the second codeword. The second sets may be received in a manner analogous to the first portion. For example, if the first portion is a first number of serial bits, the second portion may be the next number of serial bits. Using the example of FIG. 9, the second portion may be the second 4 bits along the data bus lines and the second 2 bits along the parity bus lines.

The method 1000 may include detecting errors in the second set of data bits based on the second set of data bits and the second set of parity bits, in a manner analogous to the block 1040 described above. In some embodiments, the receiving of the second set of data bits and parity bits may be performed while the detecting errors in the first set of data bits is being performed as part of a pipeline operation.

One or more of the operations and settings described herein may be optional features which may be enabled by settings of the memory module. The module may include a module settings register (e.g., 112 of FIGS. 1 and/or 232 of FIG. 2), which may store various settings related to the module's operation, in a manner analogous to the way the mode register stores setting information related to the operation of the individual memories on the die.

FIG. 11 is a module settings register according to some embodiments of the present disclosure. The module settings register 1100 may, in some embodiments, implement the module settings register 112 of FIGS. 1 and/or 232 of FIG. 2. The example module setting register 1100 of FIG. 11 includes certain settings which may be used to change various operations of the module. Different settings, more or fewer settings may be used in other example embodiments.

The module settings register 1100 stores a number of values each of which may be associated with various settings of the memory. Some settings may be associated with a single bit value. For example, if the register enables or disables a feature, then a single bit may be used. Other settings may be associated with a value which has multiple bits, for example to select various options. The table shown in FIG. 11 represents a logical organization of different settings and possible values which the register may select. The memory logic (e.g., 110 of FIG. 1) includes a number of volatile and/or non-volatile storage elements (e.g., memory cells, fuses, latch circuits) which store the values. The module settings may be set by a special write operation. Similarly, a controller may check the status of one or more entries in the module settings register by performing a special read operation.

The example module settings register 1100 includes a setting for enabling or disabling the module ECC circuit (e.g., 114 of FIG. 1). For example, there may be a register value which enables or disables the operation of the module ECC circuit. Similarly, a setting for enabling/disabling the parity bus lines may be included. This may allow these features to be disabled, for example to save on latency or power. In some embodiments, a single register value may be used to enable these features together. The example module settings register 1100 may also include a register which controls what implementation of ECC is used (e.g., as described in Table 1, above).

The example module settings register 1100 also includes various settings related to signaling protocols between the memories and the module, such as the settings described in FIGS. 6-8. For example, the module settings register 1100 may include settings for how many external DQs are active (e.g., an x4, x8, or x16 mode) and how many internal data bus lines per memory device are active. Similarly, the module settings register 1100 may enable multi-level signaling along the internal data bus lines.

The example module settings register 1100 also includes various settings related to sub-dividing the pooled ECC data, for example as described in FIGS. 9-10. The mode settings register 1100 may include a setting which disables this feature or which selects how many portions the pooled ECC data should be divided into.

Many of the registers described with respect to the module settings register 1100 may have corresponding registers in the mode registers of the memory devices. For example, the mode register may also include settings for activating an memory ECC circuit (e.g., 216 of FIG. 2), for activating the parity bus, for selecting a signaling protocol (e.g., how many data bus DQs are used, burst length, multi-level signaling etc.).

Figure 12:
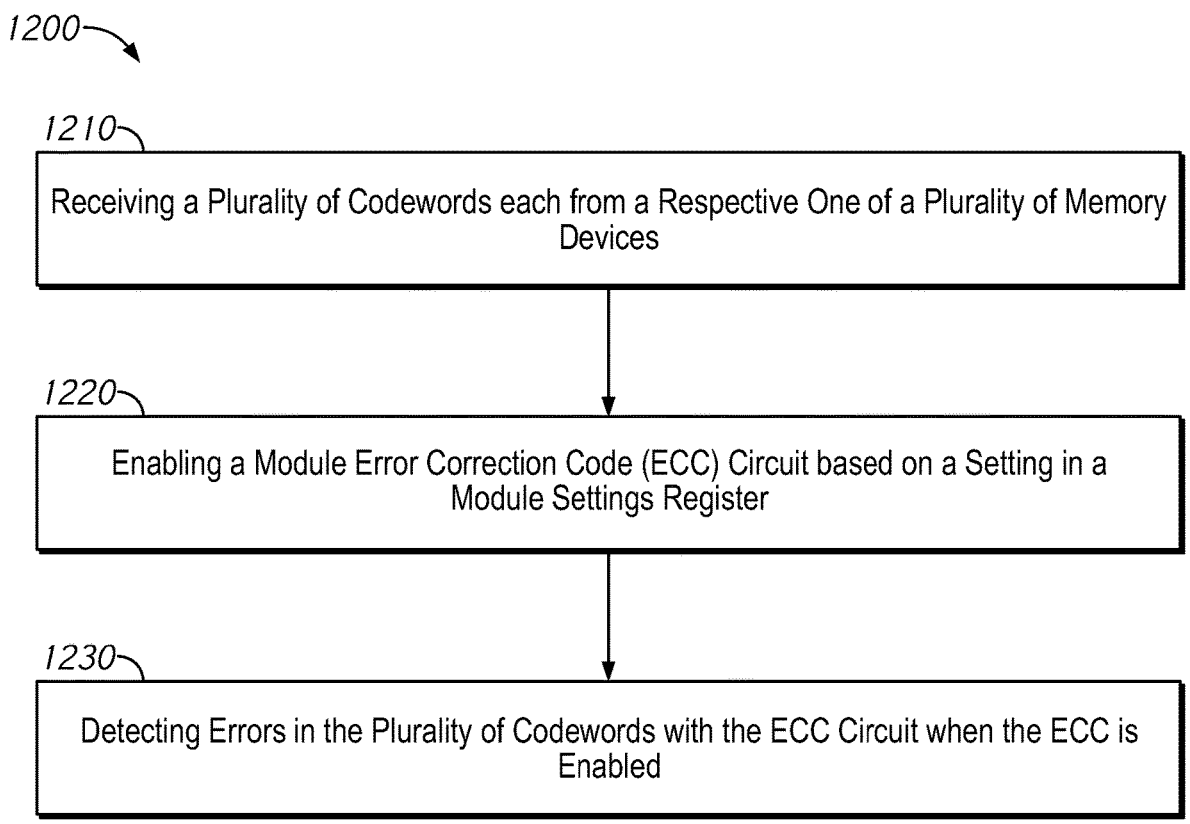
FIG. 12 is a flow chart of a method of enabling module ECC operations according to some embodiments of the present disclosure.

FIG. 12 is a flow chart of a method of enabling module ECC operations according to some embodiments of the present disclosure. The method 1200 may, in some embodiments, be implemented by one or more of the apparatuses or systems described herein, such as the module 100 of FIGS. 1 and/or 200 of FIG. 2.

The method 1200 includes box 1210, which describes receiving a plurality of codewords each from a respective one of a plurality of memory devices. The codewords may be received as part of a read operation. The plurality of memory devices may be part of a channel (e.g., 120 of FIG. 1) of the memory module. Each codeword includes a plurality of data bits read out from the memory array of that memory device. The codewords may also each include a plurality of parity bits. In some embodiments, the method 1200 may include selecting whether to provide the plurality of parity bits with each codeword. For example, a mode register setting of the memory may enable or disable the parity bits. In some embodiments, the parity bits may only be provided off the memory if the module ECC circuit is enabled. In some embodiments, parity bits may still be provided even if the module ECC circuit is disabled, however they may be ignored.

The codewords may be transmitted using a mix of parallel (e.g., along multiple bus lines) and serial (e.g., a burst length) transmission. The data bits are provided along a data bus.

In some embodiments, the method 1200 may include selecting a signaling protocol based on one or more settings of the module settings register and providing the plurality of codewords along data and parity buses (e.g., 224 and 226 of FIG. 2) using the selected such as the method 800 of FIG. 8. For the sake of brevity, features described with respect to FIG. 8 will not be repeated again with respect to FIG. 12.

The method 1200 includes block 1220 which describes enabling a module error correction code circuit based on a setting in a module settings register. The module settings register (e.g., 112 of FIG. 1) may be located on module logic of the memory module. The method 1200 may include setting a value of the setting to enable or disable the module ECC circuit. The module ECC circuit (e.g., 114 of FIG. 1) is located on module logic (e.g., 110). When the module ECC circuit is disabled, the method 1200 includes providing the codewords off the module (e.g., at external DQ terminals of the module). In some embodiments, where parity bits are included in the codewords, but the ECC circuit is disabled, the method 1200 includes removing the parity bits before providing the codewords to the external data terminals.

The method 1200 includes block 1230 which describes detecting errors in the plurality of codewords with the ECC circuit when the ECC circuit is enabled. The method 1200 may include detecting errors based on the data bits and the parity bits in the plurality of codewords. The block 1320 may be generally similar to the steps 520 and 530 of the method 500 of FIG. 5. For example, the block 1230 may include pooling data and parity bits from the plurality of parity bits and detecting and/or correcting errors based on the pooled data and parity bits. For the sake of brevity, the features described with respect to FIG. 5 will not be repeated again.

In some embodiments, block 1230 may include subdividing the pooled data and parity bits into portions and detecting/correcting errors in each portion, for example as described in FIGS. 9-10. For the sake of brevity, features described with respect to FIGS. 9-10 will not be repeated again.

In at least one aspect, the present disclosure relates to an apparatus which includes a first memory device which provides a first codeword including a first plurality of data bits and a first plurality of parity bits as part of a read operation, and a second memory device which provides a second codeword including a second plurality of data bits and a second plurality of parity bits as part of the read operation. The apparatus also includes an error correction code (ECC) circuit which pools the first codeword and the second codeword, and detects one or more errors in the pooled first and the second codeword based, in part, on the first plurality of parity bits and the second plurality of parity bits.

The first memory device may have at least one data terminal which provides at least some of the first plurality of data bits and may also have at least one parity terminal which provides at least some of the first plurality of parity bits. The second memory device may have at least one data terminal which provides at least some of the second plurality of data bits and may also have at least one parity terminal which provides at least some of the second plurality of parity bits.

The ECC circuit may correct the detected one or more errors. The first memory device and the second memory device may be packaged together on a memory module, and the ECC circuit may be part of module logic of the module. The module logic may include a deserializer circuit which may deserialize the first codeword and the second codeword. The ECC circuit may detect errors based on the deserialized first codeword and the deserialized second codeword. The ECC circuit may receive the first plurality of data bits of the first codeword along a first number of data bus lines and may provide the first plurality of data bits to a second number of external data terminals, where the first number is larger than the second number. The first memory device may provide the first codeword as one or more multi-bit signals, and the second memory device may provide the second codeword as one or more multi-bit signals.

In at least one aspect, the present disclosure relates to an apparatus which includes a plurality of memory devices and an error correction code (ECC) circuit which receives a plurality of codewords, each from a respective one of the plurality of memory devices. Each of the plurality of codewords includes a respective plurality of data bits and a respective plurality of parity bits. The ECC circuit may detect errors in the plurality of codewords based on ones of the plurality of parity bits included in at least two of the plurality of codewords.

The plurality of memory devices and the ECC circuit may be packaged on a memory module. The ECC circuit may not be located on any of the plurality of memory devices. The ECC circuit may correct the detected errors in the plurality of codewords. The ECC circuit may correct multi-bit errors in the plurality of codewords. The ECC circuit may provide the plurality of data bits from the plurality of codewords to external data terminals.

In at least one aspect, the present disclosure relates to an apparatus including module logic which includes an error correction code (ECC) circuit, a memory device including a memory array which stores a plurality of data bits and a plurality of parity bits, a data bus which transmits the plurality of data bits to the ECC circuit as part of a read operation, and a parity bus which transmits the plurality of parity bits to the ECC circuit as part of the read operation.

The memory may include a plurality of data terminals which couple the plurality of data bits to the data bus and may include at least one parity terminal which couple the plurality of parity bits to the parity bus. The data bus may include a first number of lines, and the module logic may provide the plurality of data bits to a second number of external data terminals, where the second number is different than the first number. The memory device may provide the plurality of data bits along the data bus as a multi-bit signal, and the module logic may be configured to provide the plurality of data bits as a binary signal to external data terminals.

The apparatus may include a second memory device including a second memory array which stores a second plurality of data bits and a second plurality of parity bits. The ECC circuit may detect errors in the first and the second plurality of data bits based, in part on the first and the second plurality of data bits and the first and the second plurality of parity bits.

In at least one aspect, the present disclosure relates to a method including receiving a first codeword from a first memory device and a second codeword from a second memory device at an error correction code (ECC) circuit as part of a read operation, pooling the first codeword and the second codeword into a set of data bits and a set of parity bits, and detecting errors in the set of data bits based on the set of error bits and the set of parity bits with the ECC circuit.

The method may include providing the set of data bits to external data terminals. The method may include receiving the first codeword along a first number of lines of a first data bus, receiving the second codeword along the first number of a lines of a second data bus, providing a first plurality of data bits of the first codeword to a second number of external data terminals, and providing a second plurality of data bits of the second codeword to the second number of external data terminals, wherein the first number is different than the second number.

The method may include correcting the detected errors in the set of data bits. The method may include receiving the first codeword and the second codeword as multi-bit signals. The method may include receiving a read command at module logic and provide the read command to the first memory device and the second memory device as part of the read command. The method may include deserializing the first codeword and the deserializing the second codeword at the ECC circuit.

In at least one aspect, the present disclosure relates to an apparatus including a first memory device including a mode register, module logic including a module settings register and a plurality of data bus lines coupling the first memory device to the module logic. A signaling protocol used to carry data between the module logic and the first memory device along the plurality of data bus lines is selected based on the mode register and the module settings register.

The signaling protocol may specify a number of active data bus lines. The apparatus may include a plurality of external data terminals, where an active number of the external data terminals is different than the specified number of active data bus lines. The signaling protocol may include multi-level signaling along at least some of the plurality of data bus lines.

The apparatus may include a second memory device, and a second plurality of data bus lines configured to couple the second memory device to the module logic. The signaling protocol is used to carry data between the module logic and the second plurality of data bus lines. The module logic may include an error correction code (ECC) circuit which is enabled by a setting of the module settings register. The ECC circuit may pool the data from the first memory device and the second memory device and detects errors in the pooled data.

In at least one aspect, the present disclosure relates to an apparatus which includes a plurality of memory devices each of which provides a respective one of a plurality of codewords as part of an access operation and module logic. The module logic includes a module error correction code (ECC) circuit which detects errors in the plurality of codewords when enabled, and a module settings register which stores a module ECC enable value, where the ECC circuit is enabled based on the module ECC enable value.

Each of the plurality of memory devices may include an ECC circuit and a mode register, where the ECC circuit is enabled based on a setting in the mode register. The module settings register may further includes an ECC implementation setting, and an operation of the ECC circuit may be selected based on the ECC implementation setting.

The apparatus may include a plurality of data buses each coupling a respective one of the plurality of memory devices to the module logic. Each of the plurality of codewords may include data bits and the plurality of data buses may carry the data bits. The module settings register may include at least one signaling protocol value, and a signaling protocol along the plurality of data buses may be selected based on the at least one signaling protocol value. The apparatus may include a plurality of parity buses each coupling a respective one of the plurality of memory devices to the module logic, where each of the plurality of codewords further includes parity bits and wherein the plurality of data buses are configured to carry the data bits and the plurality of parity buses are configured to carry the parity bits when enabled. The plurality of parity buses may be enabled based on a setting in the module settings register.

In at least one aspect, the present disclosure relates to a method which includes receiving a plurality of codewords each from a respective one of a plurality of memory devices, enabling a module error correction code (ECC) circuit based on a setting in a module settings register, and detecting errors in the plurality of codewords with the ECC circuit when the ECC is enabled.

Each of the plurality of codewords may include data bits and parity bits and the method may include receiving the data bits along a data bus and the parity bits along a parity bus. The method may include selecting a signaling protocol based on a setting in the module settings register and receiving the plurality of codewords using the selected signaling protocol. The method may include selecting a signaling protocol which includes multi-level signaling and receiving the plurality of codewords along a plurality of signal lines where at least one of the plurality of signal lines carries a multi-level signal. The method may include selecting a first number of active data bus lines for each of the plurality of memory devices based on a setting in the module settings register, selecting a second number of active external data terminals for each of the plurality of memory devices based on a setting in the module settings register, receiving each of the plurality of codewords along the first number of the data bus lines, and providing at least a portion of each of the plurality of codewords to the second number of the data terminals, wherein the first number is greater than the second number. The method may include selecting an ECC implementation based on a setting of the module settings register, and detecting errors in the plurality of codewords based on the selected ECC implementation.

In at least one aspect, the present disclosure relates to an apparatus which includes a plurality of memory devices and an error correction code (ECC) circuit. The plurality of memory devices each provide a respective one of a plurality of codewords as part of a read operation, where each of the plurality of codewords includes a respective plurality of parity bits and a respective plurality of parity bits. The ECC circuit detects errors in a first set of data bits and a first set of parity bits. The first set of data bits includes a first portion of the respective plurality of parity bits of each of the plurality of codewords and the first set of parity bits includes a first portion of the respective plurality of parity bits of each of the plurality of codewords.

The ECC circuit may also detect errors in a second set of data bits and a second set of parity bits, where the second set of data bits includes a second portion of the respective plurality of parity bits of each of the plurality of codewords and the second set of parity bits includes a second portion of the respective plurality of parity bits of each of the plurality of codewords. The first set of data bits and the first set of parity bits may be received at a first time, and the second set of parity bits and the second set of data bits may be received at a second time.

The apparatus may include a plurality of sets of data bus lines, each of which couples a respective one of the plurality of memory devices to the ECC circuit, where the respective one of the plurality of codewords is provided along the set of data bus lines as series of bits. The first portion may be a first number of the series of bits along the set of data bus lines.

The plurality of memory devices and the ECC circuit may be packaged on a memory module. The ECC circuit may be configured to correct an error in the first set of data bits and the first set of parity bits and detect multi-bit errors in the first set of data bits and the first set of parity bits.

In at least one aspect, the present disclosure relates to an apparatus including a first set of data bus lines coupled to a first memory device which provide a first set of serial data bits, a first parity bus line coupled to the first memory device which provide a first set of serial parity bits, a second set of data bus lines coupled to a second memory device which provide a second set of serial data bits, and a second parity bus line coupled to the second memory device which provide a second set of serial parity bits. The apparatus also includes an error correction code (ECC) circuit which detects errors in a first portion of the first set of serial data bits and the second set of serial data bits based on the first portion of the first set of serial data bits and the second set of serial data bits and a first portion of the first set of serial parity bits and the second set of serial parity bits.

The ECC circuit may also detect errors in a second portion of the first set of serial data bits and the second set of serial data bits based on the second portion of the first set of serial data bits and the second set of serial data bits and a second portion of the first set of serial parity bits and the second set of serial parity bits. The ECC circuit may detect the errors in the first portion of the first set of serial data bits and the second set of serial data bits while the second portion of the first set of serial data bits and the second set of serial data bits is being received.

The apparatus may include a module settings register, where a number of bits in the first portion is based on a setting in the module settings register. The first memory device and the second memory device may be part of a same memory channel. The apparatus may include a deserializer circuit of the ECC circuit configured to deserialize the received first set of serial data bits, second set of serial data bits, first set of serial parity bits and second set of serial parity bits.

In at least one aspect, the present disclosure relates to a method including reading a first codeword from a first memory, where the first codeword includes a first plurality of data bits and a first plurality of parity bits, reading a second codeword from a second memory, where the second codeword includes a second plurality of data bits and a second plurality of parity bits, receiving a first set of data bits and a first set of parity bits, where the first set of data bits includes a first portion of the first plurality of data bits and the second plurality of data bits, and where the first set of parity bits includes a first portion of the first plurality of parity bits and the second plurality of parity bits, and detecting errors in the first set of data bits based on the first set of data bits and the first set of parity bits.

The method may include receiving a first number of serial bits along one or more data bus lines as the first set of data bits. The method may include reading the first codeword and the second codeword as part of a read operation on a memory channel which includes the first memory device and the second memory device. The method may include setting a size of the first set of data bits and the first set of parity bits based on a setting a module settings register.

The method may include receiving a second set of data bits and a second set of parity bits, where the second set of data bits includes a second portion of the first plurality of data bits and the second plurality of data bits, and where the second set of parity bits includes a second portion of the first plurality of parity bits and the second plurality of parity bits. The method may include detecting errors in the second set of data bits based on the second set of data bits and the second set of parity bits. The method may include receiving the second set of data bits and the second set of parity bits while detecting the errors in the first set of data bits.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the an without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a first memory device including a mode register;
module logic including a module settings register;
a plurality of data bus lines coupling the first memory device to the module logic, wherein a signaling protocol used to carry data between the module logic and the first memory device along the plurality of data bus lines is selected from a plurality of signaling protocols based on the mode register and the module settings register and wherein the module settings register includes a multi-level signaling setting which enables multi-level signaling along at least some of the plurality of data bus lines and wherein the multi-level signaling includes providing the data along the at least some of the plurality of data bus lines as a signal where more than two voltage levels are used to represent more than two logical states of the signal, and
a plurality of parity bus lines coupling the first memory device to the module logic, wherein the plurality of parity bus lines are configured to provide parity bits of a codeword to or from the first memory device and the plurality of data bus lines are configured to provide data bits of the codeword to or from the first memory device.

2. The apparatus of claim 1, wherein the signaling protocol specifies number of active data bus lines.

3. The apparatus of claim 2, further comprising a plurality of external data terminals, wherein an active mmmber of the external data terminals is different than the specified number of active data bus lines.

4. The apparatus of claim 1, further comprising:
a second memory device:
a second plurality of data bus lines configured to couple the second memory device to the module logic, wherein the signaling protocol is used to carry data between the module logic and the second plurality of data bus lines.

5. The apparatus of claim 4 wherein the module logic includes an error correction code (ECC) circuit which is enabled by a setting of the module settings register.

6. The apparatus of claim 5, wherein the ECC circuit pools the data from the first memory device and the second memory device and detects errors in the pooled data.

7. The apparatus of claim 1, wherein the multi-level signaling setting enables pulse amplitude modulation 4-level (PAM4) signaling along the at least some of the plurality of data bus lines.

8. The apparatus of claim 1, wherein the module settings register includes an active data bus setting configured to determine a quantity of the plurality of data bus lines used to carry the data.

9. The apparatus of claim 8, further comprising plurality of data terminals configured to send and receive the data to and from an external device, wherein the module settings register includes an active data terminal setting configured to determine a quantity of the plurality of data terminals used to send and receive the data, and wherein the active data bus setting selects a multiple of the quantity specified by the active data terminal setting.

10. The apparatus of claim 1, wherein the module logic includes an error correction code (ECC) circuit configured to pool data across a plurality of memory devices including the first memory device, the pooled data comprising the parity bits of the code word and the data bits of the codeword.

11. An apparatus comprising:
a plurality of memory devices each configured to provide a respective one of a plurality of codewords as part of an access operation;
module logic including:
a module error correction code (ECC) circuit configured to detect errors in the plurality of codewords when enabled; and
a module settings register configured to store a module ECC enable value, wherein the ECC circuit is enabled based on the module ECC enable value;
a plurality of parity buses, wherein at least two parity buses of the plurality of parity buses are configured to couple a respective one of the plurality of memory devices to the module logic, and wherein the plurality of parity buses are configured to provide parity bits of the plurality of codewords to or from respective ones of the plurality of memory devices; and
a plurality of data buses each configured to couple a respective one of the plurality of memory devices to the module logic, wherein each of the plurality of codewords includes data bits and wherein the plurality of data buses are configured to carry the data bits,
wherein the module settings register includes at least one signaling protocol value, and wherein a signaling protocol along the plurality of data buses is selected from a plurality of signaling protocols based on the at least one signaling protocol value, and wherein the signaling protocol value includes a multi-level signaling setting which enables multi-level signaling along at least some of the plurality of data bus lines and wherein the multi-level signaling includes providing the data along the at least some of the plurality of data bus lines as a signal where more than two voltage levels are used to represent more than two logical states of the signal.

12. The apparatus of claim 11, wherein each of the plurality of memory devices comprises an ECC circuit and a mode register, wherein the ECC circuit is enabled based on a setting in the mode register.

13. The apparatus of claim 11, wherein the module settings register further includes an ECC implementation setting, and wherein an operation of the ECC circuit is selected based on the ECC implementation setting.

14. A method comprising:
selecting a signaling protocol from a plurality of signaling protocols to carry data between a module logic of a module and a memory device of a plurality of memory devices based on a setting in a module settings register and a mode register of the memory device, wherein the selected signaling protocol is a multi-level signaling protocol corresponding to a multi-level signal setting in the module settings register:
enabling, according to the multi-level signaling protocol, multi-level signaling along at least some of a plurality of data bus lines coupling the memory device to the module logic. wherein the multi-level signaling includes providing the data along the at least some of the plurality of data bus lines as a signal where more than two voltage levels are used to represent more than two logical states of the signal;
receiving a plurality of codewords each from a respective one of the plurality of memory devices using the multi-level signaling protocol, wherein each of the plurality of codewords includes data bits and parity bits, and wherein the data bits are received along a plurality of data buses and the parity bits are received along a plurality of parity buses;

enabling a module error correction code (ECC) circuit based on a setting in the module settings register; and detecting errors in the plurality of codewords with the ECC circuit when the ECC is enabled.

15. The method of claim 14, further comprising:

selecting a first number of active data bus lines for each of the plurality of memory devices based on a setting in the module settings register;

selecting a second number of active external data terminals for each of the plurality of memory devices based on a setting in the module settings register; and receiving each of the plurality of codewords along the first number of the data bus lines:

providing at least a portion of each of the plurality of codewords to the second number of the data terminals, wherein the first number is greater than the second number.

16. The method of claim 14, further comprising:

selecting an ECC implementation based on a setting of the module settings register; and detecting errors in the plurality of codewords based on the selected ECC implementation.

* * * * *

UNITED STATES PATENT AND TRADEMARK OFFICE
CERTIFICATE OF CORRECTION

PATENT NO. : 12,340,858 B2
APPLICATION NO. : 17/822912
DATED : June 24, 2025
INVENTOR(S) : Sujeet Ayyapureddi It is certified that error appears in the above-identified patent and that said Letters Patent is hereby corrected as shown below:

In the Claims

| Column | Line | Reads | Should Read |
|---|---|---|---|
| 29 | 3 | "module logie including a module" | --module logic including a module-- |
| 29 | 19 | "states of the signal, and" | --states of the signal; and-- |
| 29 | 29 | "wherein an active mmmber" | --wherein an active number-- |
| 29 | 33 | "a second memory device:" | --a second memory device;-- |
| 29 | 55 | "further comprising plurality of" | --further comprising a plurality of-- |
| 30 | 52 | "the module settings register:" | --the module settings register;-- |
| 30 | 56 | "module logic. wherein" | --module logic, wherein-- |
| 31 | 13 | "number of the data bus lines:" | --number of the data bus lines;-- |

Signed and Sealed this
Sixteenth Day of September, 2025

Coke Morgan Stewart
*Acting Director of the United States Patent and Trademark Office*